(12) United States Patent
Ozawa et al.

(10) Patent No.: US 6,522,315 B2
(45) Date of Patent: *Feb. 18, 2003

(54) DISPLAY APPARATUS

(75) Inventors: Tokuroh Ozawa; Mutsumi Kimura, both of Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/171,224

(22) PCT Filed: Feb. 17, 1998

(86) PCT No.: PCT/JP98/00656
§ 371 (c)(1),
(2), (4) Date: Oct. 16, 1998

(87) PCT Pub. No.: WO98/36407
PCT Pub. Date: Aug. 20, 1998

(65) Prior Publication Data
US 2002/0024493 A1 Feb. 28, 2002

(30) Foreign Application Priority Data

| Feb. 17, 1997 | (JP) | 9-032474 |
| Sep. 1, 1997 | (JP) | 9-236351 |
| Sep. 1, 1997 | (JP) | 9-236353 |

(51) Int. Cl.[7] .................................................. G09G 3/36
(52) U.S. Cl. .............................. 345/92; 345/93; 345/97; 345/98; 345/204; 345/206; 345/210; 345/211
(58) Field of Search ................................. 345/204, 206, 345/210, 211, 92, 93, 97, 98

(56) References Cited

U.S. PATENT DOCUMENTS

| 5,587,329 A | 12/1996 | Hseuh et al. |
| 5,670,792 A | 9/1997 | Utsugi et al. |

(List continued on next page.)

FOREIGN PATENT DOCUMENTS

| EP | 0 112 700 A | 7/1984 |
| EP | 1-0 653 741 | 5/1995 |
| EP | 0717 439 A | 6/1996 |
| JP | 08-241057 | 3/1995 |

(List continued on next page.)

*Primary Examiner*—Richard Hjerpe
*Assistant Examiner*—Jean Lesperance
(74) *Attorney, Agent, or Firm*—Oliff & Berridge, PLC

(57) ABSTRACT

A display apparatus, that includes current driving type luminescent elements, has a driving system that takes the conduction types of TFTs to control the emission of the luminescent elements into consideration. In order to reduce driving voltage and improve display quality simultaneously, the arrangement is provided such that if the second TFT which performs the "on-off" function of the current for the luminescent element is of an N channel type, the potential of the common power supply line ("com") is lowered below the potential of the opposite electrode ("op") of the luminescent element to obtain a higher gate voltage ("Vgcur"). In this case, if the first TFT connected to the gate of the second TFT is of a P channel type, when using the potential of the potential-holding electrode ("st") at the "on" state as a reference, potentials of the scanning signal ("Sgate") at the lower potential and the common power supply line ("com") are rendered of the same polarities with respect to this potential of the potential-holding electrode ("st"). Therefore, the potential of the image signal ("data") to turn "on" can be shifted within the range of the driving voltage in the display apparatus (1) in the direction to reduce resistances at the "on" states of the first TFT and the second TFT to reduce driving voltage and improve display quality.

24 Claims, 32 Drawing Sheets

U.S. PATENT DOCUMENTS 5,828,429 A    10/1998  Takemura
5,929,847 A *  7/1999   Yanagi et al. ............... 345/204
5,995,073 A * 11/1999   Isami et al. .................. 345/89
6,011,529 A *  1/2000   Ikeda .......................... 345/77
6,023,308 A    2/2000   Takemura

FOREIGN PATENT DOCUMENTS

| JP | 8-129358    | 5/1996 |
| JP | 08 129360 A | 5/1996 |
| JP | 8-227276    | 9/1996 |
| JP | 08 241057 A | 9/1996 |
| WO | WO 96 06456 A | 2/1996 |

* cited by examiner

FIG. 6(A) SECTION C-C'
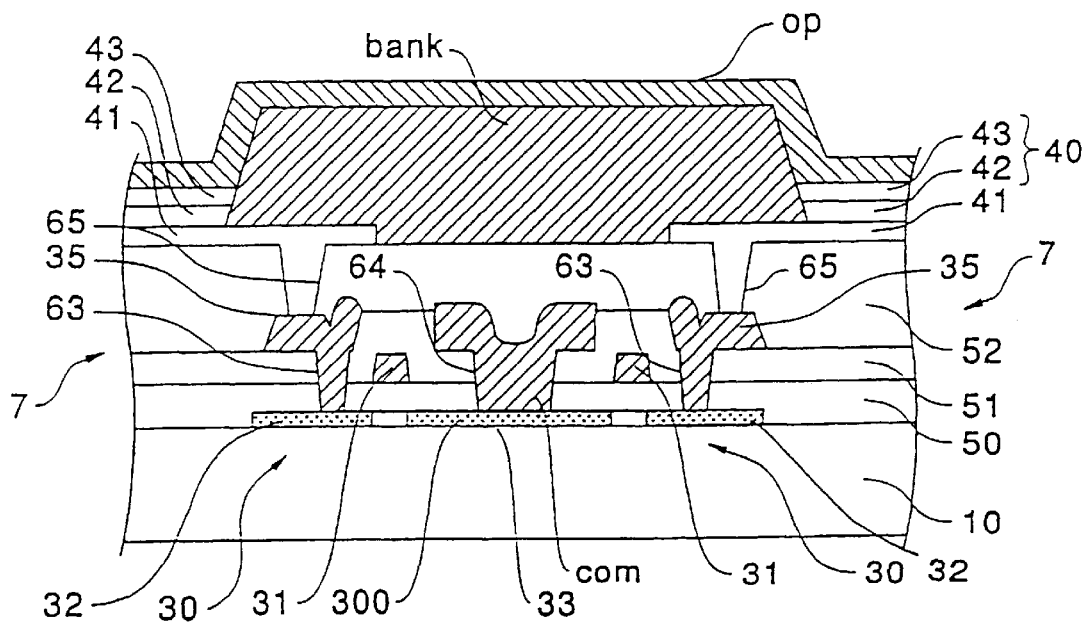
FIG. 6(B) SECTION C-C'
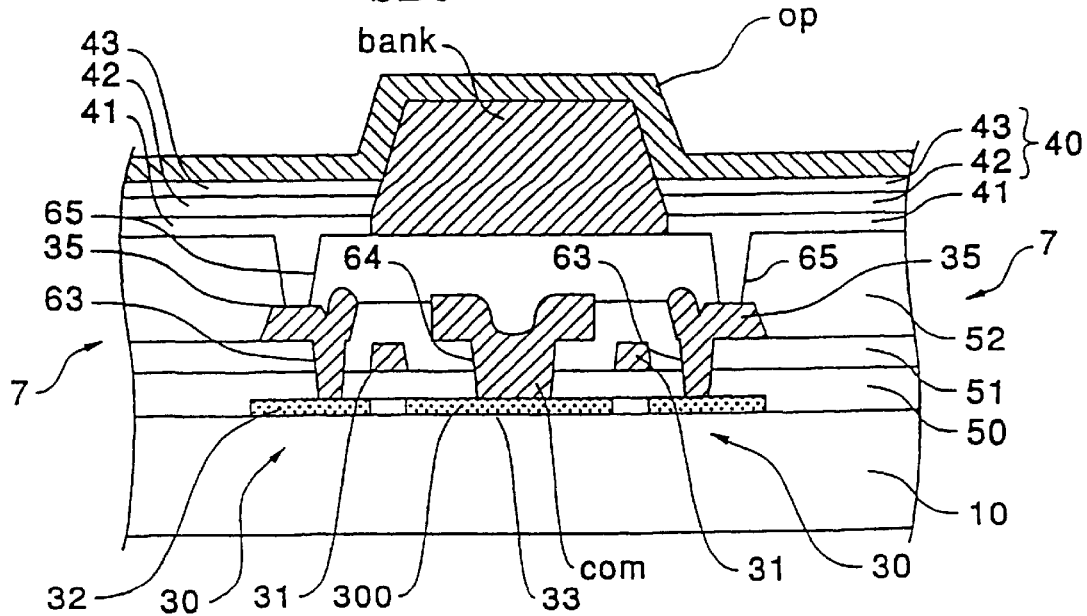

AMPERE/VOLT CHARACTERISTICS
N CHANNEL TYPE TFT

AMPERE/VOLT CHARACTERISTICS
P CHANNEL TYPE TFT

SECTION E-E'

"ON"   "OFF"

"ON"      "OFF"

"ON"  "OFF"

"ON"  "OFF"

GATE VOLTAGE WAVE FORM
SCANNING DIRECTION
Sgate1→Sgate2

GATE VOLTAGE WAVE FORM
SCANNING DIRECTION
Sgate2→Sgate1

1

DISPLAY APPARATUS

BACKGROUND OF THE INVENTION

1. Field of the Invention

The present invention relates to an active matrix type display apparatus including luminescent elements such as EL (Electro-luminescence) elements or LED (Light Emitting Diode) elements which emit light by driving current flowing in thin films of organic semiconductors or the like, and also including thin film transistors (hereinafter TFT's) to control the emitting operation of these luminescent elements. More particularly, the present invention relates to a technique of driving each element formed in this type of display apparatus.

2. Description of the Related Art

Active matrix type display apparatuses incorporating luminescent elements of a current controlling type, such as EL elements and LED elements, have been proposed. Since any luminescent element employed in this type of display apparatus emits by itself, there are advantages in using no back-light and in having a minimal dependence on the viewing angle and the like.

FIG. 31 is a block diagram illustrating an active matrix type display apparatus incorporating organic thin film EL-elements of an electric charge filling type, as an example of these types of display apparatuses. In the display apparatus 1A shown in this figure, a plurality of scanning lines "gate", a plurality of data lines "sig" extending in a direction that intersects the direction in which the scanning line "gate" extend, a plurality of common power supply lines "com" extending parallel to the data lines "sig", and a plurality of pixels 7 located at the intersections of the data lines "sig" and the scanning lines "gate" which are formed on a transparent substrate.

Each pixel 7 comprises a first TFT 20 in which a scanning signal is supplied to the gate electrode (a first gate electrode) through the scanning gate, a holding capacitor "cap" which holds an image signal supplied from the data line "sig" via the first TFT 20, a second TFT 30 in which the image signal held by the holding capacitor "cap" is supplied to the gate electrode (a second gate electrode), and an luminescent element 40 (indicated as a resistor) into which the driving current flows from the common power supply line "com" when the element 40 is electrically connected to the common power supply line "com" through the second TFT 30.

In the above display apparatus 1A, both the first TFT 20 and the second TFT 30 are conventionally formed, as with an N channel type TFT or a P channel type TFT, as shown in an equivalent circuit diagram of FIG. 32, from the viewpoint of simplifying the production process, for example, in the case of an N channel type. Taking the N channel type as an example, as shown in FIGS. 33(A) and (B), when the high potential image signal "data" is written into the holding capacitor "cap" from the data line "sig", while the scanning signal "Sgate" supplied through the scanning line "gate" has become higher in potential to turn the first TFT 20 "on", the second TFT 30 is held in the "on" state. Consequently, in the luminescent element 40, the driving current keeps flowing from a pixel electrode 41 to an opposite electrode "op" in the direction indicated by the arrow "E" and consequently, the luminescent element 40 keeps emitting (the "on" state). On the other hand, when the image signal "data", which is lower than the intermediate between the potential of the common power supply line "com" and the potential of the opposite electrode "op", is written into the holding capacitor "cap" from the data line "sig", while the scanning signal "Sgate" supplied through the scanning line "gate" has become higher in its potential to turn the first TFT 20 "on", the second TFT 30 is turned "off" and consequently, the luminescent element 40 is turned "off" (the "off" state).

In the above display apparatus 1A, a semiconductor thin film, an insulating thin film, an electrode, etc., which constitute each element, are formed by thin films deposited on the substrate. Considering the heat resistance of the substrate, a low-temperature process is often used to form the thin films. Therefore the quality of the thin film is poor, as is evidenced by the frequent defects caused by a physical-property difference between a thin film and a bulk, which result in problems such as an electrical breakdown, and wherein time-degradation is apt to arise in the TFT and similar devices.

In the case of a liquid crystal display apparatus incorporating liquid crystals as light modulation elements, although it also uses the thin films, time-degradation can be suppressed not only in the liquid crystal but also in the TFT, because the light modulation element is driven by AC power. On the other hand, in the display apparatus 1A incorporating luminescent elements of the current controlling type, time-degradation is more often encountered in the TFT than in the liquid crystal display apparatus insofar as the apparatus is essentially driven by D.C. power. Although improvements have been made in the structure of the TFT and the process techniques in the display apparatus 1A, incorporating luminescent elements of the current controlling type, they do not yet seem to be improved enough.

In the case of incorporating the liquid crystals as the light modulation elements, the power consumption is small because the light modulation element is controlled by the voltage which causes the current flow in each element to be only momentary. On the other hand, in the display apparatus 1A incorporating luminescent elements of the current controlling type, a constant driving current is required to keep the luminescent element "on", and this results in high power consumption and the risk of the frequent occurrence of electrical breakdown and time-degradation.

Further, in the liquid crystal display apparatus, the liquid crystal can be AC-driven by one TFT per one pixel. On the other hand, in the display apparatus 1A incorporating luminescent elements of the current controlling type, the luminescent element 40 is DC-driven by two TFTs 20, 30 per one pixel. This raises the driving voltage, and exacerbates the aforementioned problems, such as electrical breakdown and time-degradation. For example, as shown in FIG. 33(A), the gate voltage "Vgsw" of the first TFT, when selecting a pixel, corresponds to the potential difference between the potential equals to the higher potential of the scanning signal "Sgate" and the potential of the potential-holding electrode "st" (the potential of the holding capacitor "cap" or the potential of the gate electrode of the second TFT 30). Therefore when the potential of the potential-holding electrode "st" and, hence, the gate voltage "Vgcur" of the second TFT 30 are raised to make the luminescent element 40 emit in a high luminance, the gate voltage "Vgsw" of the first TFT 20 is lowered correspondingly. Therefore, the greater amplitude of the scanning signal "Sgate" has to be employed, requiring the higher driving voltage in the display apparatus 1A. Besides, in the aforementioned display apparatus 1A, since when the luminescent element 40 is "off", the potential of the image signal "data" is made lower than the intermediate potential between the potential of the common power supply line "com" and the potential of the opposite electrode "op"

in order to turn the second TFT 30 "off", there is another problem of increased amplitude of the image signal "data". Accordingly, in this display apparatus 1A, special consideration for the power consumption and the withstanding of voltage of the TFT, etc. is needed compared to the liquid crystal display apparatus. However, the conventional display apparatus 1A has not been provided with the sufficient consideration of these factors.

SUMMARY OF THE INVENTION

Accordingly, an object of the present invention is to provide a display apparatus, which improves display image quality as well as suppresses power consumption, electric breakdown and deterioration with time by reducing the driving voltage, relying upon a driving method which takes into account the conduction types of TFTs used for controlling emission operations of the current-driven light-luminescent elements so as to reduce the driving voltage, which improves both the display image quality and characteristics such as power consumption, breakdown and time-degradation.

To accomplish the aforementioned object, the present invention in proposes a display apparatus comprising, arranged on a substrate, a plurality of scanning lines, a plurality of data lines intersecting the scanning lines, a plurality of common power supply lines, a plurality of pixels formed by the scanning lines and the data lines in a matrix form, each of said pixels comprising a first TFT having a first gate electrode which is supplied with a scanning signal through the scanning line, a holding capacitor which holds an image signal supplied by the data line though the first TFT, a second TFT having a second gate electrode which is supplied with the image signal held by the holding capacitor, an emitting thin film, which emits light due to the driving current which flows between the pixel electrode and an opposite electrode, which is opposed to the pixel electrode with the emitting thin film provided therebetween, when the pixel electrode is electrically connected to the common power supply line through the second TFT, wherein the potential of the common power supply line is set at a lower level than that of the opposite electrode when the second TFT is of an N channel type.

In the display apparatus according to the present invention, since the gate voltage of the second TFT at "on" state corresponds to the difference between the potential of gate electrode (the potential of the image signal) and one of the potential of the common power supply line and the pixel electrode, the gate voltage of the second TFT is arranged so as to correspond to the potential difference between the common power supply line and the potential-holding electrode by optimizing relative potential values between the common power supply line and the opposite electrode of the luminescent element according to the conduction type of the second TFT. For example, when the second TFT is of an N channel type, the potential of the common power supply line is set at a lower level than that of the opposite electrode of the luminescent element. Since this potential of the common power supply line can be set low enough different from the potential of the pixel electrode, the large "on" current in the second TFT can be obtained to get a high luminance display. If the higher potential can be obtained in the second TFT when the pixel is turned "on", the potential of the image signal can be lowered to reduce its amplitude, and this results in a reduction of the driving voltage in the display apparatus. Therefore, there are advantages in reducing the power consumption, and simultaneously the problem of withstanding voltage, which concerns each element formed by a thin film, is not encountered.

In accordance with the present invention, if the second TFT is of an N channel type, it is preferable that the potential of the image signal supplied through the data line to the pixel to be turned "on" state is lower than, or is equal to, the potential of the opposite electrode. In this structure, the amplitude of the image signal can also be reduced to reduce the driving voltage in the display apparatus while keeping the second TFT in the "on" state.

In accordance with the present invention, if the second TFT is of an N channel type, it is preferable that the potential of the image signal supplied through the data line to the pixel to be "off" state is higher than, or is equal to, the potential of the common power supply line. That is, when the pixel is turned "off", the gate voltage (the image signal) is not applied enough to turn the second TFT "off" completely. The "off" state can be realized, combined with non-linear characteristics of the luminescent element. Accordingly, the amplitude of the image signal can be reduced to decrease the driving voltage in the display apparatus and to increase the frequency of the image signal.

In accordance with the present invention, if the second TFT is of a P channel type, conversely to each of the above described structures, a relative relation of each potential is reversed. That is, when the second TFT is of a P channel type, a display apparatus is featured that the potential of common power supply line is set at a higher level than that of the opposite electrode. In this case, it is preferable that the potential of the image signal supplied through the data line to the pixel to be "on" state is higher than, or is equal to, the potential of the opposite electrode. It is also preferable that the potential of the image signal supplied through the data line to the pixel to be "off" state is lower than, or is equal to, the potential of the common power supply line.

In accordance with the present invention, it is preferable that the first TFT and the second TFT are formed by TFTs which are in opposite conduction types. That is, it is preferable that if the first TFT is of an N channel type, the second TFT is of a P channel type, while if the first TFT is of a P channel type, the second TFT is of an N channel type. In this structure, as will be described later in relation to in detail, speeding up of the display operation can be achieved, by only changing the potential of the image signal to turn "on" to the direction that the resistance of the first TFT at the "on" state is reduced within the range of the driving voltage in the display apparatus. Since it means that the potential of the image signal to put the pixel "on" state is changed to the direction that the resistance of the second TFT at the "on state" is reduced at this time, as a result, a display luminance can be improved. Thus, reduction at the driving voltage and improvement in the display quality can be accomplished simultaneously.

Another embodiment of the invention describes a display apparatus comprising, arranged on a substrate, a plurality of scanning lines, a plurality of data lines intersecting the scanning lines, a plurality of common power supply lines, a plurality of pixels formed by the scanning lines and the data lines in a matrix form, each pixel comprising a first TFT having a first gate electrode which is supplied with a scanning signal through the scanning line, a holding capacitor which holds an image signal supplied through the data line via the first TFT, a second TFT having a second gate electrode which is supplied with the image signal held by the holding capacitor, and a luminescent element comprising an emitting thin film which is provided between a pixel electrode formed by each of the pixels and an opposite electrode opposed to the pixel electrode and emits light due to the driving current which flows between the pixel electrode and the opposite electrode when the pixel electrode is electrically connected to the common power supply line through the second TFT, wherein the first TFT and the second TFT are formed as the thin film transistors which are of opposite conduction types relative to each other.

In accordance with the present invention, since the first TFT and the second TFT are of opposite conduction types, for example, if the first TFT is of an N channel type, the second TFT is of a P channel type, a height of the selecting pulse is to be raised to increase a storage capacity of the first TFT, while the potential of the image signal is to be lowered to reduce the "on" resistance of the second TFT and to increase an emitting luminance. These optimizations in the scanning signal and the image signal are effective at shifting the gate voltage of the first TFT to the direction of increasing the "on" current of this TFT in accordance with that of the image signals, which is at the level to turn the luminescent element "on" state, are written into the holding capacitor, during the selection of the pixel. Therefore, the image signal can be written into the holding capacitor smoothly from the data line through the first TFT. The gate voltage of the first TFT in the event of selecting the pixel corresponds to the potential difference between the scanning signal at the higher potential side and the potential-holding electrode at the time of "on" (the potential of the image signal to turn "on", the potential of the holding capacitor or the gate electrode potential of the second TFT). The gate voltage of the second TFT corresponds to the potential difference between the potential-holding electrode at the time of "on" and the common power supply line. When using the potential of the potential-holding electrode at the time as a reference, the potential of the scanning signal at the higher potential side and the common power supply line are the same in polarity. If the potential of the potential-holding electrode at the time of "on" (the potential of the image signal to turn "on") is changed, both gate voltages of the first TFT and the second TFT change correspondingly, in the same direction and by the same amount. Therefore, a speed up of the display operation can be accomplished, provided that the image signal potential to turn "on" is changed to decrease the resistance of the first TFT at the time of "on". At this time, since the potential of the image signal to turn "on" is changed in the direction that the resistance of the first TFT at the time of "on" is reduced, as a result, a display luminance can be improved. Thus the reduction in the driving voltage and improvement in the display quality can be accomplished simultaneously.

In accordance with the present invention, it is preferable that the gate voltage applied to the second TFT in the pixel at "off" state is in the same polarity as of the second TFT in the "on" state, and also the value of the gate voltage does not exceed the threshold voltage of the second TFT. That is, when the pixel is turned "off", the gate voltage (the image signal) is not applied enough to completely turn the second TFT "on" state. Thus, the amplitude of the image signal can be reduced to achieve the increased frequency of the image signal.

In this structure, if the first TFT is of an N channel type and the second TFT is of a P channel type, it is preferable that the potentials of the scanning signal to turn the first TFT "on" and the common power supply line are the same, and the potential of the gate electrode applied to the second TFT of the pixel in the "off" state is lower than the potential which is obtained by subtracting the threshold voltage of the first TFT from the scanning signal potential at which the first TFT is turned "on". In contrast, if the first TFT is of a P channel type and the second TFT is of an N channel type, it is preferable that the potential of the scanning signal when the first TFT is turned "on" is the same as that of the common power supply line, and also the potential of the gate electrode applied to the second TFT of the pixel in the "off" state is higher than the potential which is obtained by adding the threshold voltage of the first TFT to the scanning signal potential at which the first TFT is turned "on". As described above, if the potential of the scanning signal when the first TFT is turned "on" and that of the common power supply line are equated, the number of levels of each driving signal is reduced. Thus, the number of input terminals to the display apparatus and the number of power sources can be reduced simultaneously, and this results in reduced power consumption.

In accordance with the present invention, it is preferable that one of the electrodes, which is provided at the holding capacitor and is opposite to the electrode to be electrically connected to the second gate electrode of the second TFT, is supplied with a pulse, a potential polarity of which is opposite to the selecting pulse of the scanning signal with a delay behind the selecting pulse. In this structure, since the writing of the image signals into the holding capacitor can be supplemented, the potential of the image signal applied to the gate electrode of the second TFT can be shifted in the direction to increase a luminance, without increasing the amplitude of the image signal.

Further, another embodiment of the invention describes a display apparatus comprising, arranged on a substrate, a plurality of scanning lines, a plurality of data lines intersecting the scanning lines, a plurality of common power supply lines, a plurality of pixels formed by the scanning lines and the data lines in a matrix form, each pixel comprising a first TFT having a first gate electrode which is supplied with a scanning signal through the scanning line, a holding capacitor which holds an image signal supplied through the data line via the first TFT, a second TFT having a second gate electrode which is supplied with the image signal held by the holding capacitor, and an luminescent element comprising an emitting thin film which is provided between a pixel electrode formed by each of the pixels and an opposite electrode opposed to the pixel electrode and emits light due to the driving current which flows between the pixel electrode and the opposite electrode when the pixel electrode is electrically connected to the common power supply line through the second TFT, wherein one of electrodes of the holding capacitor, opposite to that electrically connected to the second gate electrode of the second TFT, is supplied with a pulse, the potential polarity of which is opposite to the selecting pulse of the scanning signal with a delay behind the selecting pulse.

In this structure, since the writing of the image signals into the holding capacitor can be supplemented, the potential of the image signal applied to the gate electrode of the second TFT can be shifted in the direction to increase a luminance, without increasing the amplitude of the image signal.

In any of the aforementioned embodiments, an organic semiconductor film can be used as the emitting thin films, for example.

In accordance with the present invention, in any of the aforementioned embodiments, the second TFT can be formed so as to perform in the saturated region to prevent an abnormal current from generating in the luminescent element, which would result in the generation of a crosstalk, etc. at another pixel because of the voltage drop, or the like.

Further, it is possible to prevent unevenness of the threshold voltage from influencing a display operation by forming the second TFT so as to operating in the linear region.

BRIEF DESCRIPTION OF THE DRAWINGS

FIG. 6(A) is a cross-sectional view taken on line C–C' of FIG. 3, and FIG. 6(B) is a schematic representation indicating an effect when the apparatus is constructed as shown in FIG. 6(A).

BEST MODE FOR CARRYING OUT THE INVENTION

Figure 1:
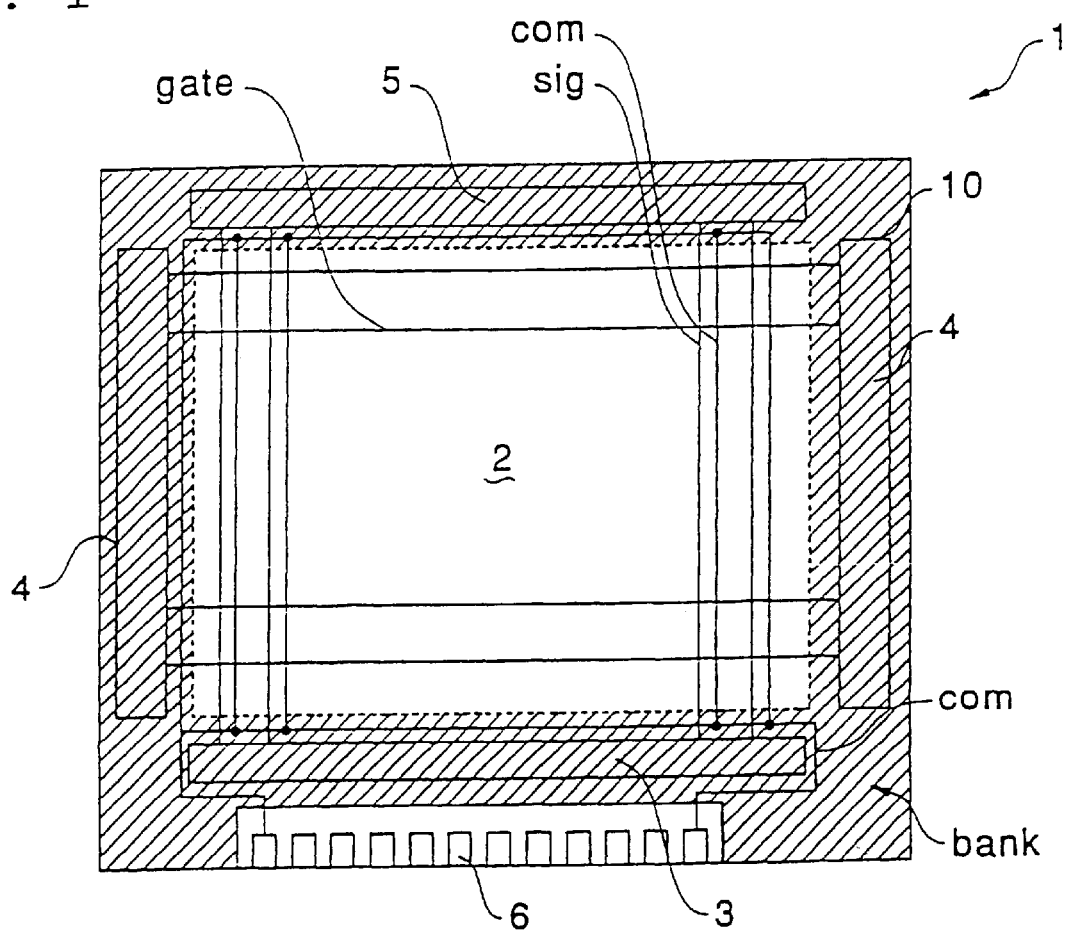
FIG. 1 is a plan view schematically illustrating a display apparatus in accordance with the present invention.

Embodiments of the invention will be described with reference to the drawings. Before showing each embodiment of the invention, reference will be made to the common structure for each embodiment, wherein the portions having common functions in each embodiment are designated by the same reference numerals, respectively, to avoid duplicate description.

(The General Construction of an Active Matrix Substrate)

Figure 2:
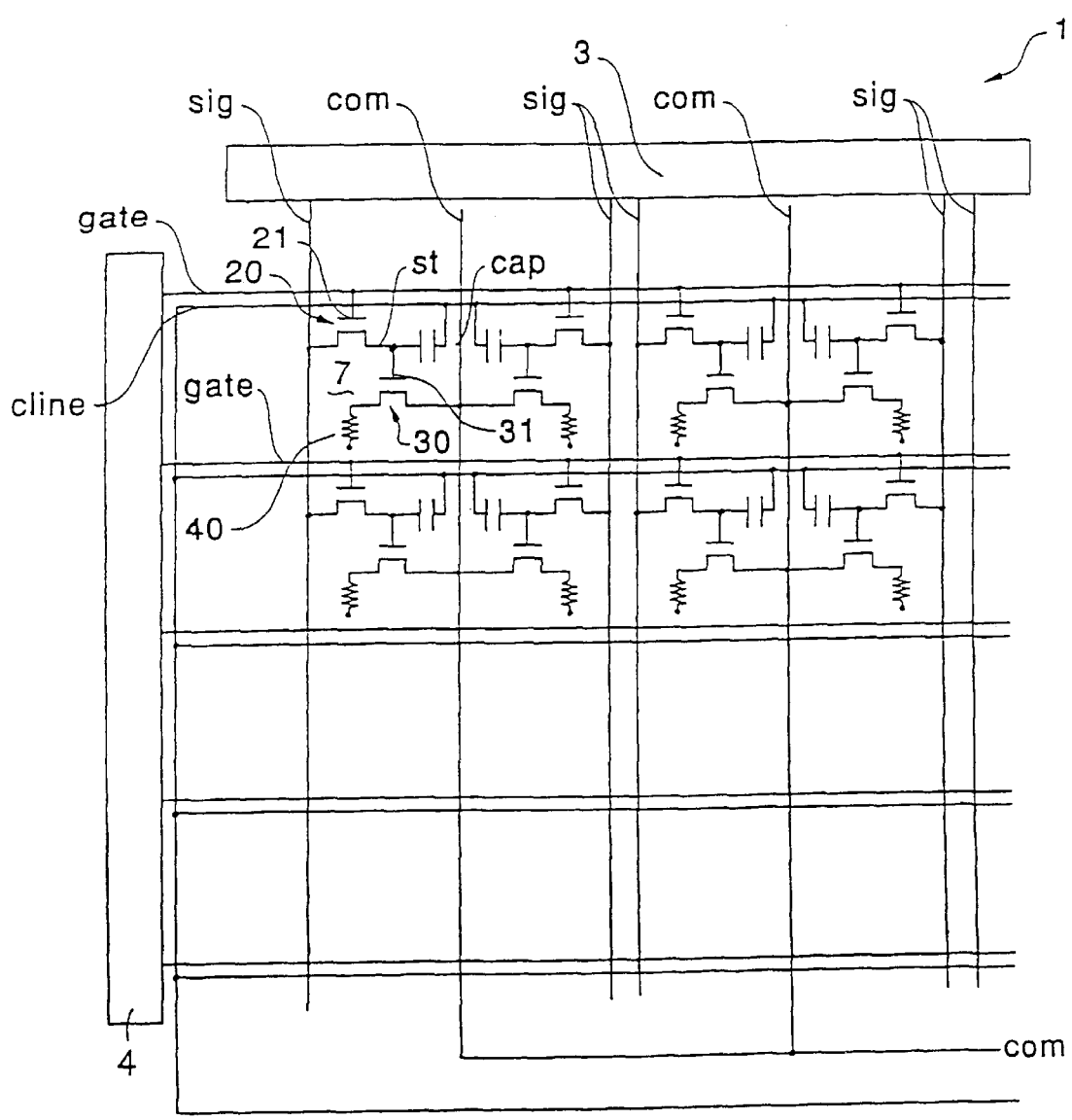
FIG. 2 is a block diagram illustrating a basic construction of a display apparatus in accordance with the present invention.

FIG. 1 is a schematic block diagram schematically illustrating a general layout of a display apparatus, and FIG. 2 is an equivalent circuit diagram of an active matrix formed therein.

As illustrated in FIG. 1, the center portion of a transparent substrate 10 as a basic body is a display portion 2, in a display apparatus 1 of the embodiment. In the peripheral region of the transparent substrate 10, at the upper and lower sides as viewed on the figure, an inspection circuit 5, and a driving circuit 3 at the data side, which outputs an image signal to a data line "sig", are formed respectively. And in the right and left sides as viewed on the figure, driving circuits 4 at the scanning side, which output scanning signals to a scanning line "gate", are formed. In each of the driving circuits 3,4, a complementary type TFT comprising a shift register circuit, a level shifter circuit, an analogue switch circuit, etc. is formed by an N type TFT and a P type TFT. A packaging pad 6, which is a terminal group for inputting the image signals, the various electric potentials and the pulse signals, is formed in the peripheral region on the transparent substrate 10, outside of the data side driving circuit 3.

In the display apparatus 1, a plurality of the scanning lines "gate" and a plurality of the data lines "sig", which extend in a direction that intersects the direction in which the scanning lines "gate" extend, are formed on the transparent substrate 10, in the same way as in an active matrix substrate of a liquid crystal display apparatus. As shown in FIG. 2, many pixels 7 are formed in a matrix form by the crossing of the data lines "sig" and the scanning lines "gate".

In any of the pixels 7, a first TFT 20 is formed, in which a scanning signal is supplied to a gate electrode 21 (a first gate electrode) through the scanning line "gate". One side of a source-drain region of the TFT 20 is electrically connected to the data line "sig", while the other side of the source-drain region is electrically connected to a potential-holding electrode "st". That is, a capacitor line "cline" is formed parallel to the scanning line "gate" and a holding capacitor "cap" is formed between the capacitor line "cline" and the potential-holding electrode "st". Accordingly, when the first TFT 20 is selected by the scanning signal and turned to "on", an image signal, which is supplied from the data line "sig" and forwarded through the first TFT 20, is written in the holding capacitor "cap".

A gate electrode 31 (a second gate electrode) of the second TFT 30 is electrically connected to the potential-holding electrode "st". While one side of the source-drain region of the second TFT 30 is connected to a common power supply line "com", the other side of the source-drain region is electrically connected to one of electrodes (a pixel electrode, as will be referred to below) of an luminescent element 40. The common power supply line "com" is held at a constant potential. When the second TFT 30 is turned "on", the electric current from the common power supply line "com" flows to illuminate the luminescent element 40 through the second TFT 30, and makes the luminescent element 40 emit.

In the display apparatus 1 constructed as stated above, since the driving current flows through the current route formed by the luminescent element 40, the second TFT 30 and the common power supply line "con", the flow of the current stops when the second TFT 30 is turned "off". However, in the display apparatus 1 according to this embodiment, when the first TFT 20 is selected by the scanning signal and turned "on", the image signal, which is supplied from the data line "sig" and forwarded through the first TFT, is written into the holding capacitor "cap". Accordingly, since the potential of the gate electrode of the second TFT 30 is held at equal to that of the image signal by the holding capacitor "cap", even if the first TFT 20 is turned "off", the second TFT 30 remains "on". Therefore, the driving current in the luminescent element 40 keeps flowing and this pixel remains illuminated. This state will be maintained until new image data is written into the holding capacitor "cap" and the second TFT 30 turns "off".

In the display apparatus 1, various arrangements are possible with the common power supply line "con", the pixel 7 and the data line "sig". In this embodiment, a plurality of the pixels 7, having the luminescent elements 40 power supply, in which the driving current is supplied via common power supply line "com", are disposed on both sides of the common power supply line "com". Two data lines "sig" are arranged at the side of these pixels 7 opposite to the common power supply line "com". That is, a unit including data line "sig", a pixel group connected to this data line, a piece of common power supply line "com", another pixel group connected to this common power supply line and another data line "sig" which supplies the pixel signals to this pixel group, is repeated in the direction that the scanning line "gate" extends. Each common power supply line "com" supplies driving currents to two lines of the pixels 7. In this embodiment, in the each of two pixels 7 provided with the common power supply line "com" therebetween, the first TFTs 20, the second TFTs 30 and the luminescent elements 40 are disposed symmetrically with respect to the common power supply line "com" in order to make the electrical connection between these elements and each of wiring layers easier.

Thus, in this embodiment, since a piece of the common power supply line "com" drives two lines of the pixels, only one half of the number of the common power supply lines "com" is needed compared with the number of the common power supply lines "com" when each of them is formed per one line of the pixels, and also the space reserved between the common power supply line "com" and the data line "Sig" formed in the same layer can be eliminated. Therefore, the area for wiring can be reduced on the transparent substrate 10, and consequently, the display performance can be improved in terms of luminance, contrast ratio and so forth. In addition, since the common power supply lines are arranged such that each common power supply line "com" is connected to two lines of the pixels, each two data lines "sig" are arranged side-by-side and supply the image signal to each line of the pixels group.

(The Pixel Construction)

The structure of each pixel 7 in the display apparatus 1 formed as described above will be explained in detail with reference to FIGS. 3 to 6.

Figure 3:
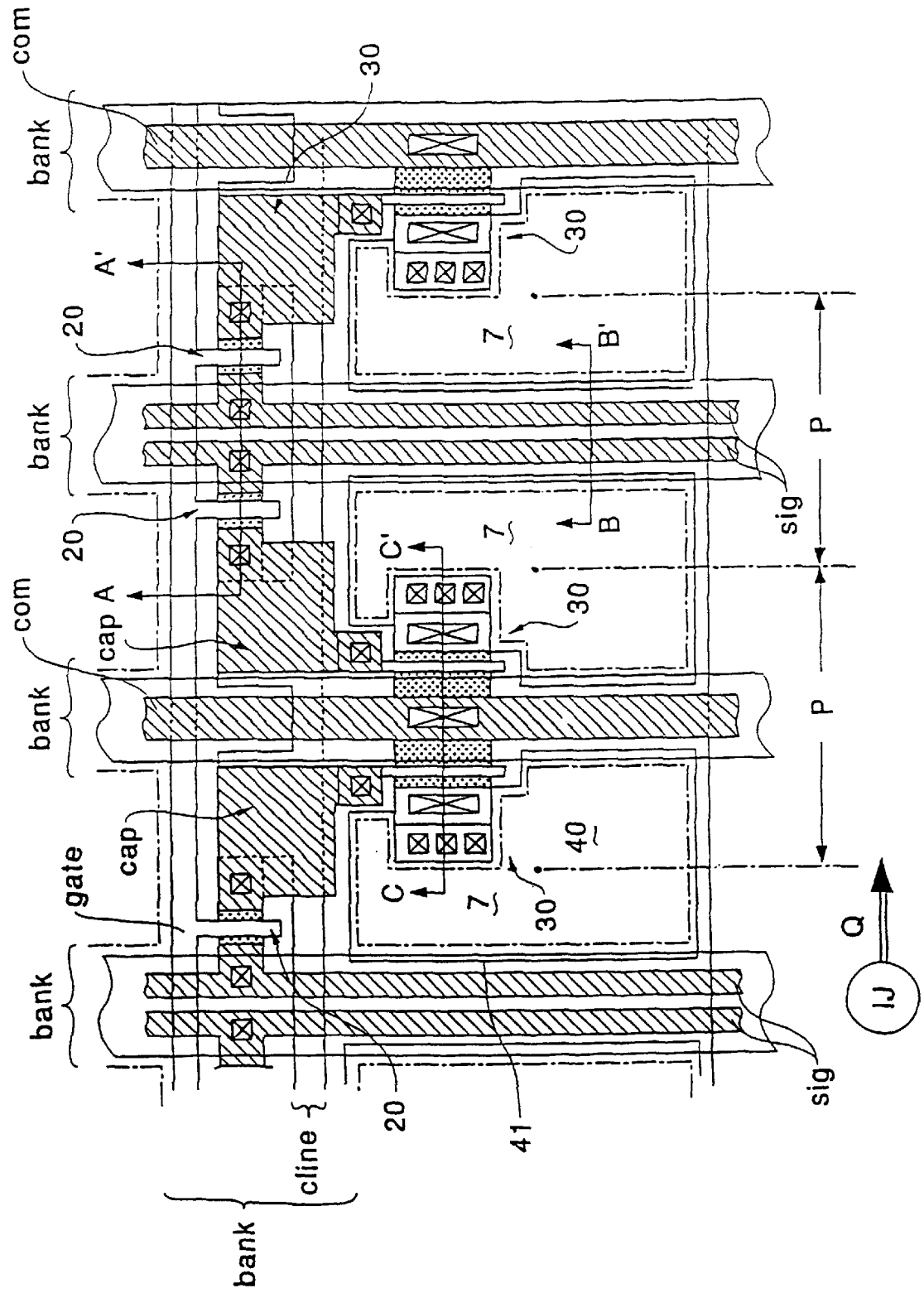
FIG. 3 is an exploded plan view illustrating a pixel in the display apparatus shown in the FIG. 2.
Figure 4:
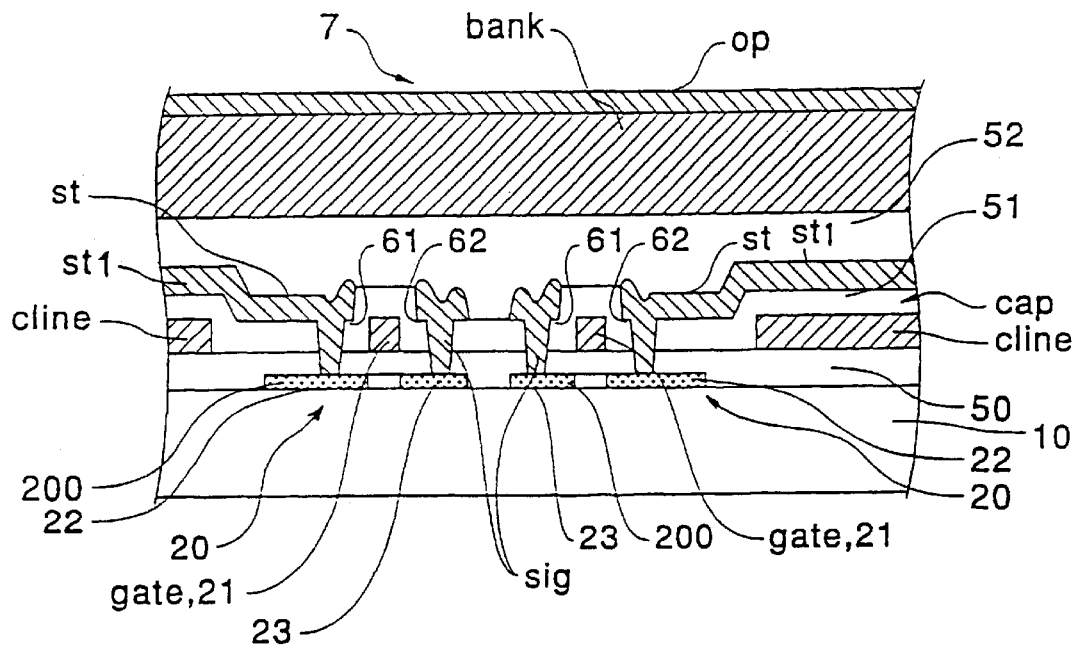
FIG. 4 is a cross-sectional view taken on line A–A' of FIG. 3.
Figure 5:
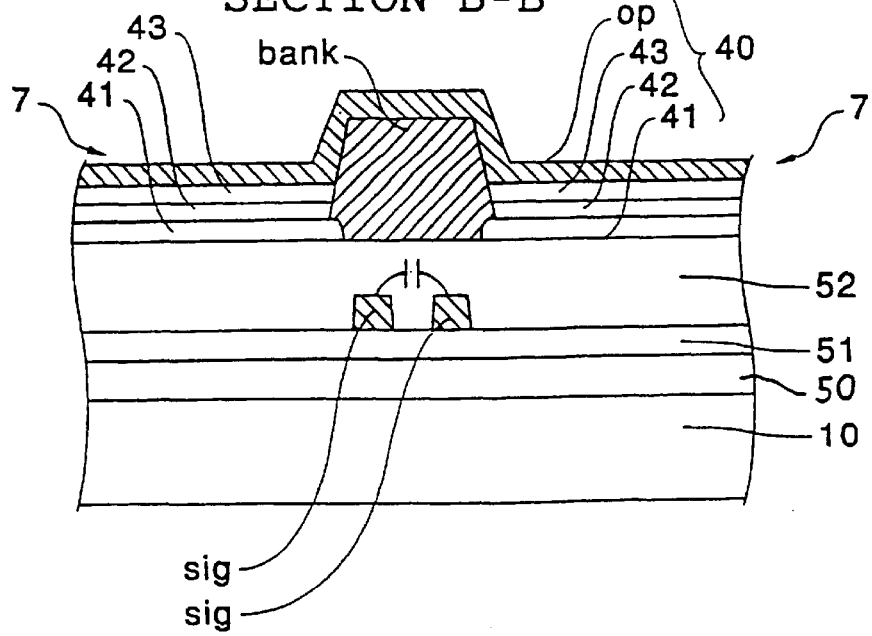
FIG. 5 is a cross-sectional view taken on line B–B' of FIG. 3.

FIG. 3 is an enlarged plan view showing three pixels 7 of a plurality of pixels 7 formed in the display apparatus 1 of this embodiment. FIG. 4, FIG. 5 and FIG. 6 are section views taken on line A–A', B–B' and C–C' of FIG. 3, respectively.

First, at the position taken on line A–A' in FIG. 3, a silicon film 200, shaped like islands, is formed on the transparent substrate 10 per each pixel 7 to form the first TFT 20, as shown in FIG. 4. A gate insulating film 50 is formed on the surface of the silicon film 200. The gate electrode 21 (a portion of the scanning line "gate") is formed on the surface of the gate-insulating film 50. The source-drain regions 22 and 23 are formed by self-alignment with respect to the gate electrode 21. On the front side of the gate insulating film 50, a first inner-layer-insulating film 51 is formed. The source drain-regions 22 and 23 are electrically connected to the data line "sig" and the potential-holding electrode "st", respectively, through contact holes 61 and 62 formed in the inner-layer-insulating film 51.

In each pixel 7, in parallel with the scanning line "gate", the capacitor line "cline" is formed in the same inner-layer as the scanning line "gate" and the gate electrode 21 (between the gate-insulating film 50 and the first inner-layer-insulation film 51). An extension "st1" of the potential-holding electrode "st" overlays on this capacitor line "cline" through the first inner-layer-insulation thin film 51. In this way, the capacitor line "cline" and the extension "st1" of the potential holding electrode "st" form the holding capacitor "cap" incorporating the first inner-layer-insulation film 51 as a dielectric film. On the front side of the potential-holding electrode "st" and on that of the data line "sig", a second inner-layer-insulation thin film 52 is formed.

At the position indicated by line B–B' in FIG. 3, as shown in FIG. 5, two of the data lines "sig", which correspond to each pixel 7, are arranged in parallel on the surfaces of the first and the second inner-layer-insulation films 51 and 52 formed on the transparent substrate 10.

At the position indicated by line C–C' in FIG. 3, as shown in FIG. 6(A), a silicon film 300, shaped like islands, is formed on the transparent substrate 10 to form the second TFT 30, spreading across two pixels, which sandwich the common power supply line "com" therebetween. The gate insulating film 50 is formed on the surface of the silicon film 300. The gate electrodes 31, corresponding to each pixel 7, are formed on the surface of the gate insulating film 50, sandwiching the common power supply line "com", and the source-drain regions 32 and 33 are formed by self-alignment with respect to the gate electrodes 31. On the front side of the gate insulating film 50, the first inner-layer-insulation film 51 is formed. A source drain-region 32 is electrically connected to a junction electrode 35 through a contact hole 63 formed on the first inner-layer-insulation film 51. On the other hand, the common power supply line "com" is electrically connected to a portion of the source-drain region 33, which is common between two of the pixels provided at the center of the silicon film 300, through a contact hole 64 of the first inner-layer-insulation film 51. On the surfaces of the common power supply line "com" and the junction electrode 35, the second inner-layer-insulation film 52 is formed. On the surface of the second inner-layer-insulation film 52, a pixel electrode 41 is formed that includes an ITO film. This pixel electrode 41 is electrically connected to the junction electrode 35 through a contact hole 65 formed on the second inner-layer-insulation film 52, and then electrically connected to the source drain region 32 of the second TFT 30 through the junction electrode 35.

(Characteristics of the Luminescent Element)

Since any type of structures of the luminescent element 40 can be used in the apparatus of the invention, a typical structure will be described below.

Figure 7A:
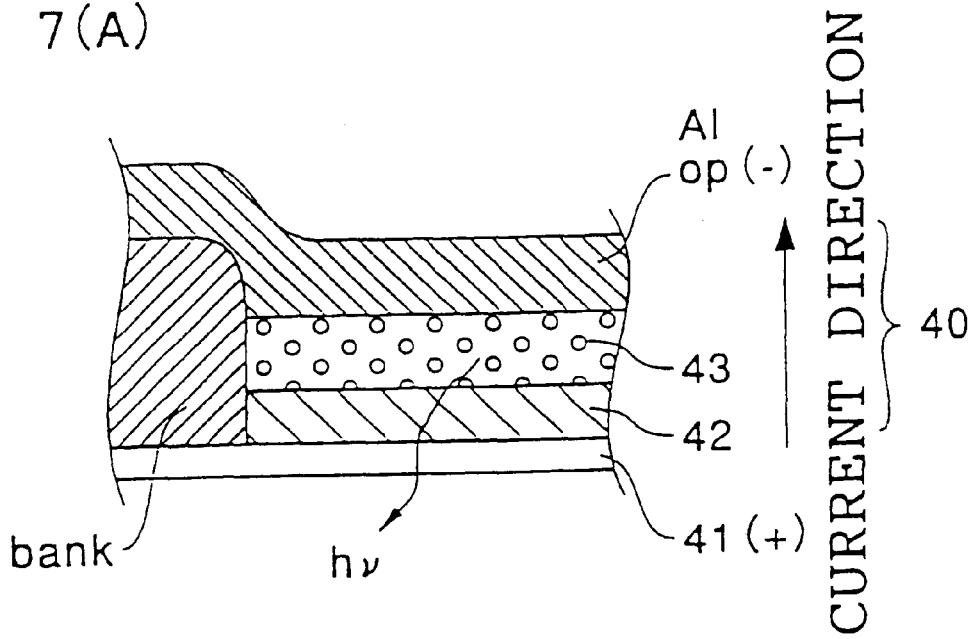
FIG. 7(A) and FIG. 7(B) are cross-sectional views of the luminescent elements utilized in the display apparatus shown in FIG. 2, respectively.
Figure 7B:
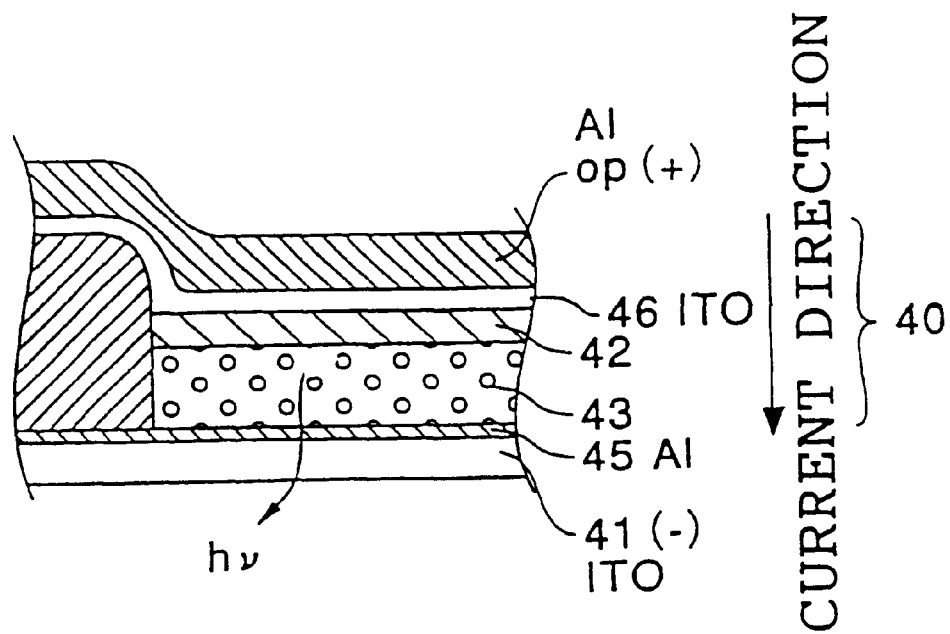

First, the pixel electrode 41 comprising the ITO film constitutes one electrode (the positive electrode) of the luminescent element 40, as shown in FIG. 7(A). On the surface of the pixel electrode 41, a hole injection layer 42 and an organic semiconductor film 43, as an emitting thin film, are laminated. Further, an opposite electrode "op" (the negative electrode) comprising a metal film, such as a lithium-containing aluminum film or a calcium film, is formed on the surface of the organic semiconductor film 43. This opposite electrode "op" is to be a common electrode formed entirely, or in striped patterns, on the transparent substrate 10, and is held at a constant potential. In contrast, when the driving current flows in the reverse direction to the luminescent element 40 that is shown in FIG. 7(A), the luminescent element 40 may be formed as shown in FIG. 7(B). In this structure, the pixel electrode 41 (the negative electrode) comprising the ITO film, the lithium-containing aluminum electrode 45, which is very thin to be almost transparent, the organic semiconductor layer 43, the hole injection layer 42, the ITO film layer 46 and the opposite electrode "op" (the positive electrode), comprising a metal film such as the aluminum containing lithium film or the calcium film, are laminated in this order from bottom to top layer. In this structure, even in the case that the driving current of opposite polarity flows in each of the luminescent elements 40 shown in FIGS. 7(A) and (B), the emitting characteristics of the elements 40 are not changed since the structure of the electrode layers, with which the hole injection layer 42 and the organic semiconductor layer 43 contact directly, are the same structures as the former. Any of the luminescent elements 40 shown in FIGS. 7(A) and (B) has the pixel electrode 41 comprising the ITO film in the under-layer side (the substrate side). Light is emitted from the backside of the transparent substrate 10 through the pixel electrode 41 and the transparent substrate 10, as shown by the arrow "hv".

Figure 8A:
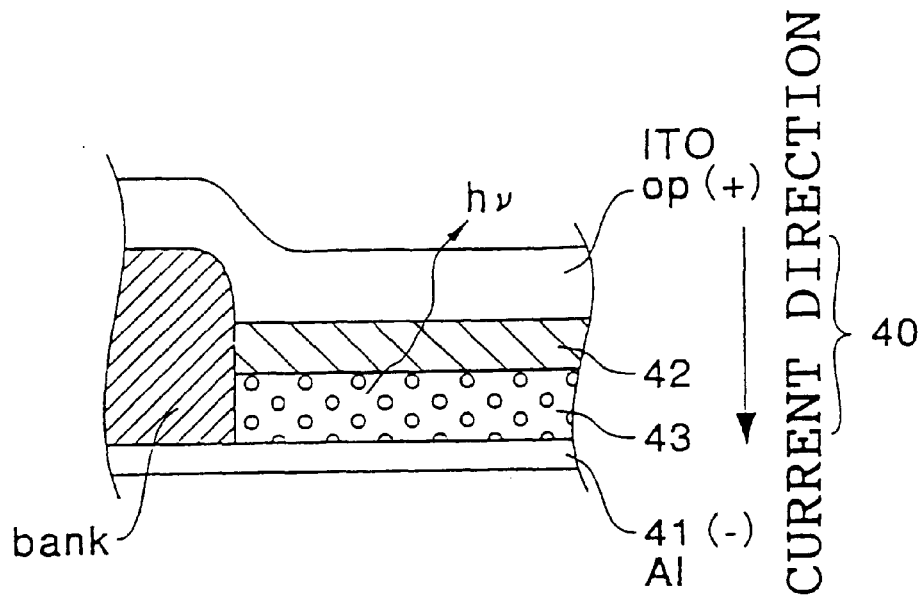
FIG. 8(A) and FIG. 8(B) are cross-sectional views of the luminescent elements having a different structure from the pixels shown in FIGS. 7(A) and 7(B), respectively.
Figure 8B:
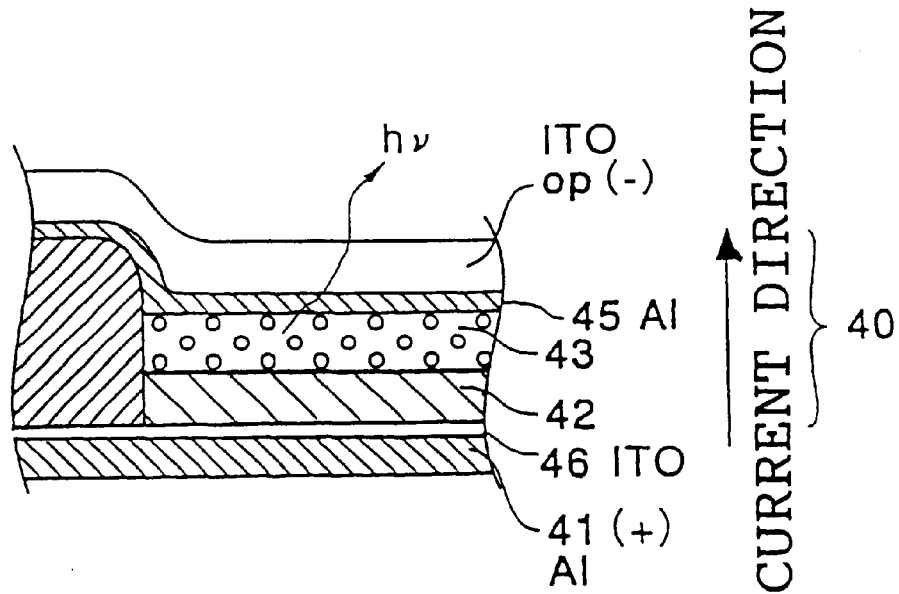

In contrast, when the luminescent element 40 is formed as shown in FIGS. 8(A) and (B), light is emitted from the front side of the transparent substrate 10 through the opposite electrode "op", as shown by the arrow "hv". That is, as shown in FIG. 8(A), the organic semiconductor layer 43 and the hole injection layer 42 are laminated on the surface of the pixel electrode 41 (the negative electrode) comprising a metal film, such as aluminum containing lithium. Further, the opposite electrode "op" comprising the ITO film (the positive electrode) is formed on the surface of the hole injection layer 42. This opposite electrode "op" is also a common electrode formed entirely, or in striped patterns, and is held at a constant potential. In contrast, in order to flow the driving current in the reverse direction of the luminescent element 40 that is shown in FIG. 8(A), the luminescent element 40 may be formed as shown in FIG. 8 (B). This luminescent element 40 is formed by the pixel electrode 41 (the positive electrode) comprising the metal thin film such as aluminum containing lithium, the ITO film layer 46, the hole injection layer 42, the organic semiconductor layer 43, the lithium-containing aluminum electrode 45, which is very thin to be almost transparent, and the opposite electrode "op" (the negative electrode), comprising the ITO film, which are laminated from bottom to top in this order.

When forming any type of structures of the luminescent element 40, the manufacturing process is not complicated, even if the top-and-bottom positional relationship is reversed, provided that the hole injection layer 42 and the organic semiconductor layer 43 are formed inside of a bank layer "bank" by an ink jet method as described below. Further, in the case that the lithium-containing aluminum electrode 45, which is very thin to be almost transparent, and the ITO film layer 46 are added, there is no obstacle to displaying images, even if the lithium-containing aluminum electrode 45 is laminated in the same region of the pixel electrode 41 or if the ITO film 46 is laminated in the same region of the opposite electrode "op". Therefore, the lithium-containing aluminum electrode 45 and the pixel electrode 41 can be patterned, either separately or simultaneously, using the same resist-mask. Similarly, the ITO film layer 46 and the opposite electrode "op" can be patterned, either separately or simultaneously, using the same resist-mask. The lithium-containing aluminum electrode 45 and the ITO film layer 46 may be formed only at the inside region of the bank layer "bank" as a matter of course.

Further, the opposite electrode "op" may be formed by the ITO film, and the pixel electrode 41 may be formed by the metal film. In any case, light is emitted from the transparent ITO film.

Figure 9:
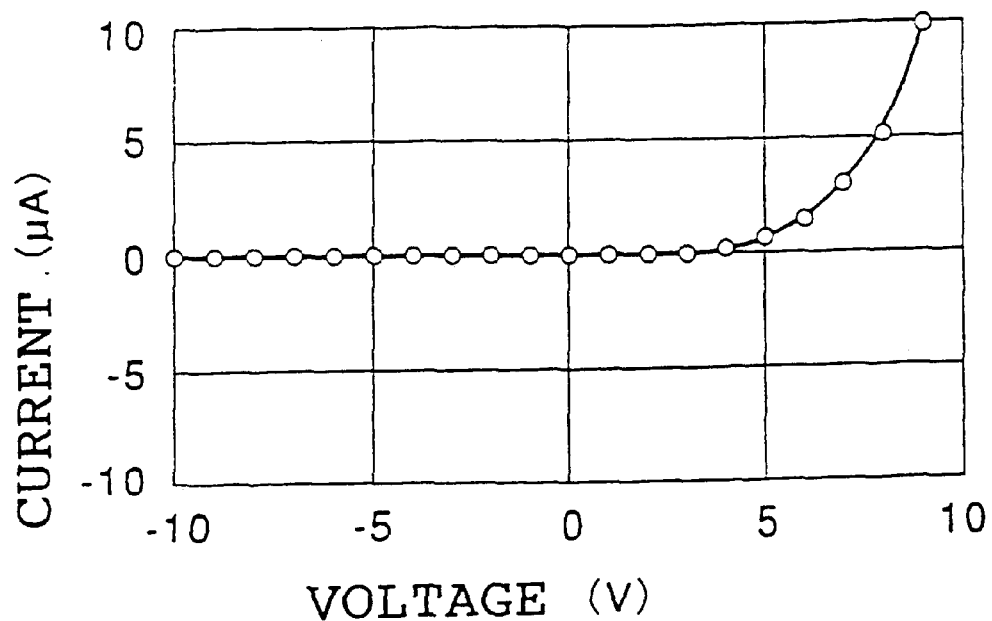
FIG. 9 is a graph showing a current-voltage characteristic of the luminescent elements shown in FIG. 7(A) and FIG. 8(B).
Figure 10:
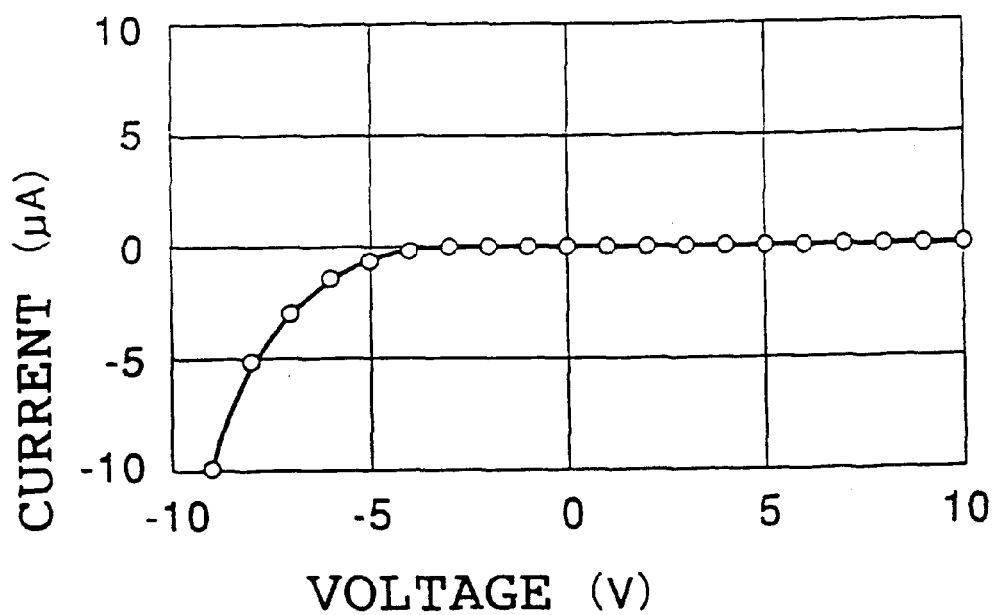
FIG. 10 is a graph showing a current-voltage characteristic of the luminescent elements shown in FIG. 7(B) and FIG. 8(A).

The voltage is applied across the opposite electrode "op" as the positive electrode, and the pixel electrode 41 as the negative electrode, of the luminescent element 40 formed as described above. As shown in FIG. 9 (ampere-volt characteristics of the luminescent element 40 shown in FIG. 7(A) and FIG. 8(B)), and FIG. 10 (ampere-volt characteristics of the luminescent element 40 shown in FIG. 7(B) and FIG. 8(A)), the current through the organic semiconductor layer 43 (the driving current) increases suddenly in the region where the applied voltage (x-axis/the potential of the opposite electrode "op" to the pixel electrode 41) rises above the threshold value and there is "on-state", i.e., the low resistance state. Consequently, the luminescent element 40 emits light as the electro-luminescence element or as the LED element. This emitting light from the luminescent element 40 is reflected by the opposite electrode "op" and is emitted through the transparent pixel electrode 41 and the transparent substrate 10. In contrast, in the region where the applied voltage (x-axis/the potential of the opposite electrode "op" to the pixel electrode 41) drops below the threshold voltage, the "off-state", i.e., the high resistance state is provided, and the current through the organic semiconductor layer 43 (the driving current) stops. Consequently, the light luminescent element 40 is turned "off". The threshold voltages in the examples shown in FIGS. 9 and 10 are approximately +2 V and approximately −2 V, respectively.

Although the light emitting efficiency tends to somewhat decline, the hole injection layer 42 may be omitted. There may be a case that without incorporating the hole injection layer 42, an electron injection layer is formed at the opposite position to where the hole injection layer 42 is formed with respect to the organic semiconductor layer 43. Further, both the hole injection layer 42 and the electron injection layer may be incorporated.

(TFT Characteristics)

Figure 11:
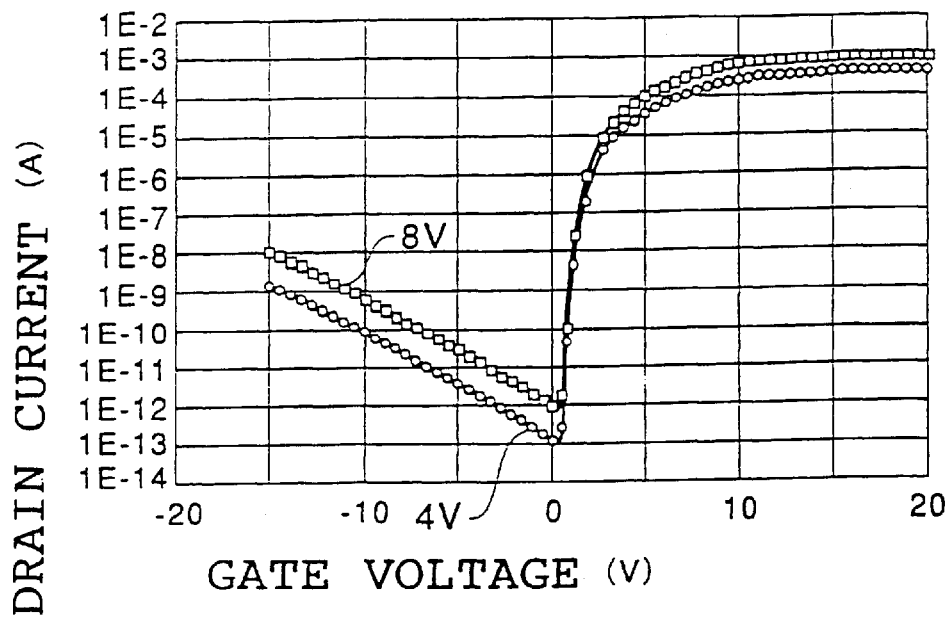
FIG. 11 is a graph showing current-voltage characteristics of an N channel type of TFT.
Figure 12:
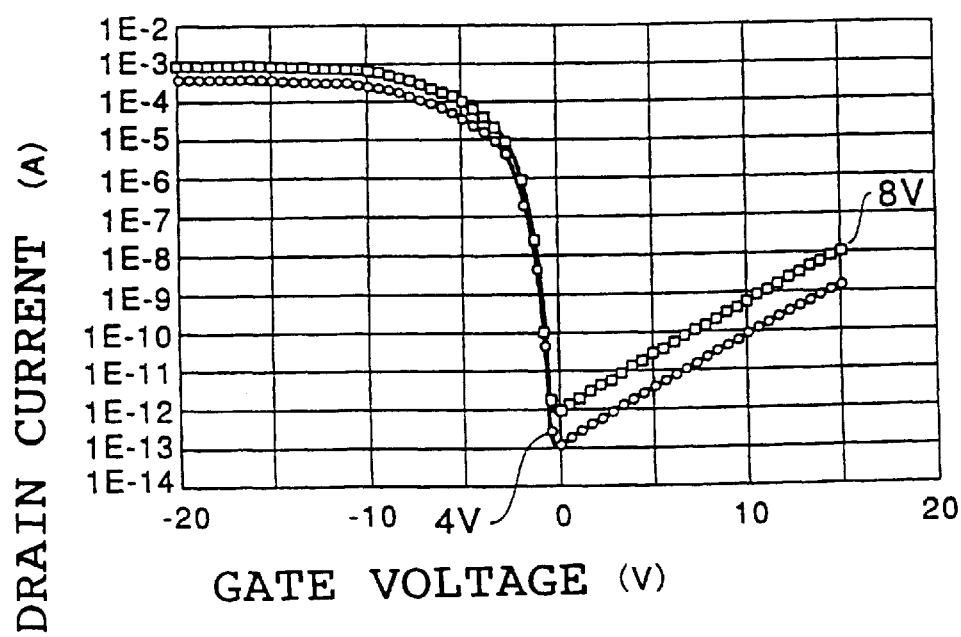
FIG. 12 is a graph showing current-voltage characteristics of a P channel type of TFT.

As the TFTs (the first TFT 20 and the second TFT 30 shown in FIG. 2) for controlling light emission of the luminescent element 40 that is formed as described above, the ampere-volt characteristics of N channel type and P channel type TFTs are shown in FIGS. 11 and 12, respectively (in any of the Figures, examples of the drain voltages are 4V and 8V are shown). As understood by these Figures, the TFT operates "ON-OFF" control action depending on the gate voltage applied across the gate electrode. That is, when the gate voltage rises over the threshold voltage, the TFT will be in "on-state" (the low resistance state) to increase the drain current. In contrast, when the gate voltage decreases below the threshold voltage, the TFT will be "off-state" (the high resistance state) to reduce the drain current.

(A Method of Producing the Display Apparatus)

In a method of producing the display apparatus 1 that is formed as described above, the steps up to the formation of the first TFT 20 and the second TFT 30 on the transparent substrate 10 are almost the same as the steps for producing the active matrix substrate of the liquid crystal display apparatus 1. Accordingly, a general description will be made simply with reference to FIGS. 13(A)–13(G).

FIGS. 13(A)–13(G) are diagrammatic flow sectional views illustrating the steps for forming each component of the display apparatus 1 under a temperature condition below 600° C.

Figure 13A:
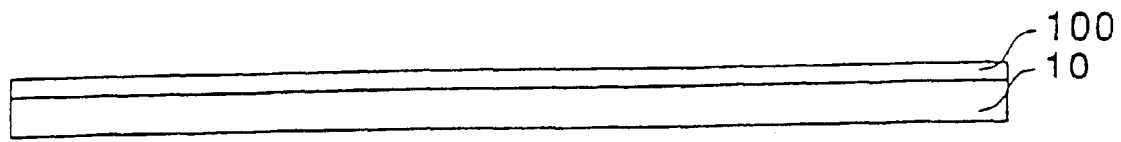
FIGS. 13(A)–13(G) is a flow sectional view illustrating a method for producing a display apparatus in accordance with the present invention.

As shown in FIG. 13(A), a groundwork protection film (not shown in figure) comprising a silicon oxide film ranging about 2000 to 5000 Å in thickness is formed, as needed, on the transparent substrate 10 by a plasma enhanced CVD method utilizing TEOS (tetraethoxysilane) or oxygen gas, etc., as a material. Then, after the substrate temperature is set at 350° C., a semiconductor film 100 comprising an amorphous silicon film ranging about 300 to 700 Å thick is formed on the surface of the groundwork protection film by a plasma enhanced CVD method. Next, the semiconductor film 100 comprising the amorphous silicon film is subjected to crystallization such as laser annealing or a solid-phase growth method to crystallize the semiconductor film 100 into a poly-silicon film. The laser annealing utilizes, for example, an excimer laser line beam having a long side of 400 mm, and its output power is, for example, 200 mJ/cm$^2$. The line beams are scanned so that the line beams overlap with each other at portions corresponding to 90% of the peak laser power in the short side.

Figure 13B:
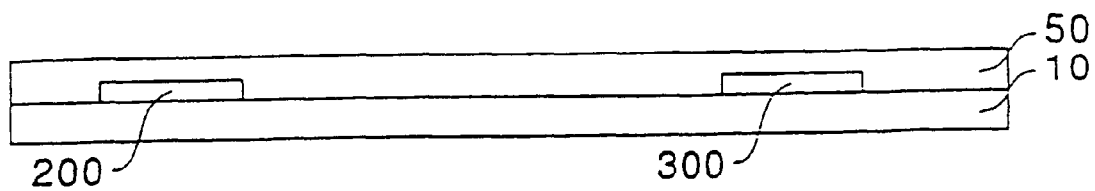

Then, as shown in FIG. 13(B), by a patterning, the semiconductor film 100 is formed into semiconductor films 200, 300, shaped as islands, and on the surface of them, the gate insulating film 50 comprising a silicon oxide film or a silicon nitride film, ranging about 600 to 1500 Å in thickness, is formed by a plasma enhanced CVD method utilizing TEOS (tetraethoxysilane) or oxygen gas, etc., as a material.

Figure 13C:
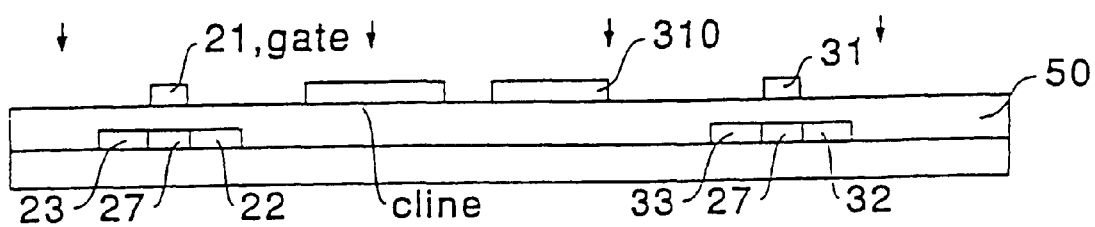

Next, as shown in FIG. 13(C), after a conductive film comprising a metal film, such as aluminum, tantalum, molybdenum, titanium, tungsten, etc., is formed by a sputtering method, the gate electrodes 21 and 31, as portions of the scanning lines "gate", are formed by a patterning. In this step, the capacitor line "cline" is also formed. In the figure, reference number 310 indicates an extensional part of the gate electrode 31.

At this state, by an implantation of impurities, such as high concentration phosphorus ions or boron ions, etc., the source-drain regions 22, 23, 32, and 33 are formed by self-alignment with respect to the gate electrodes 21 and 31 on the silicon films 200 and 300. The portions where the impurity is not implanted are channel regions 27 and 37. In this embodiment, a different conduction type TFT may be formed on the same substrate, as will be described later. In this case, in the impurity implantation step, the impurity implantation will be performed masking a region to form the opposite conduction type TFT.

Figure 13D:
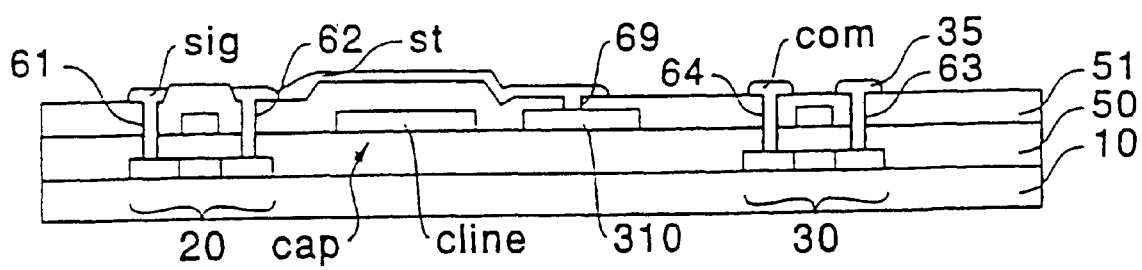
Figure 13E:
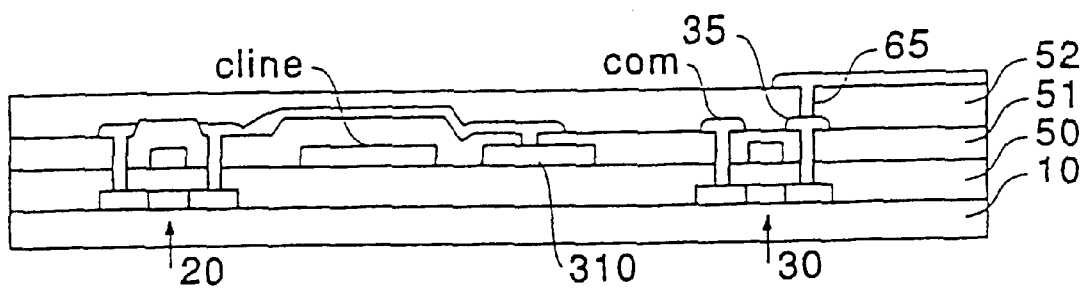

Then, as shown in FIG. 13(D), after the inner-layer-insulation film 51 is formed, the contact holes 61,62,63,64 and 69 are formed, and then the data line "sig", the potential-holding electrode "st" having the extended portion "st1" overlapped with the capacitor line "cline" and with the extended portion 310 of the gate electrode 31, the common power supply line "com", and the junction electrode 35 are formed. Consequently, the potential-holding electrode "st" is electrically connected to the gate electrode 31 through the contact hole 69 and the extended portion 310. As mentioned above, the first TFT 20 and the second TFT 30 are formed. Further, the holding capacitor "cap" is formed by the capacitor line "cline" and the extended portion "st1" of the potential-holding electrode Next as shown in FIG. 13(E), the second inner-layer-insulation film 52 is formed, and the contact hole 65 is formed at the place corresponding to the junction electrode 35 in this inner-layer insulation film. Then, after the conductive film is formed all over the surface of the second inner-layer insulation film 52, patterning is performed, and the pixel electrode 41 is formed to electrically connect the conductive film to the source-drain region 32 of the second TFT 30 through the contact hole 65.

Figure 13F:
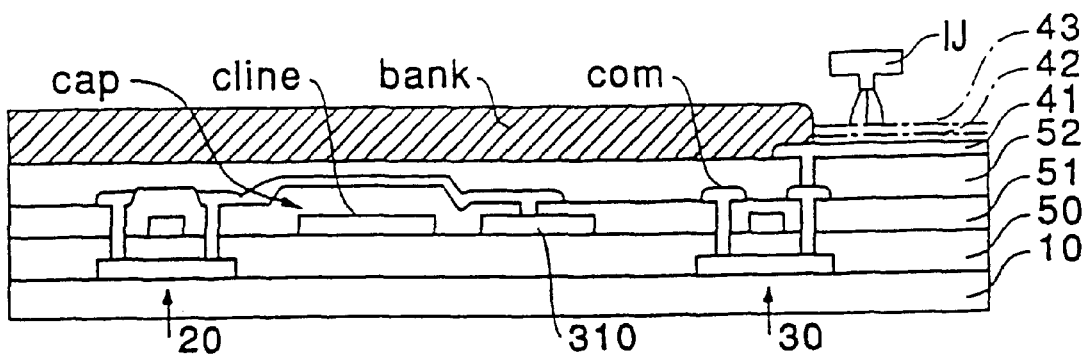

Next as shown in FIG. 13(F), after a black resist layer is formed on the front side of the second inner-layer insulation film 52, a bank layer "bank" is formed, leaving this resist to surround the regions for forming the organic semiconductor film 43 of the luminescent element 40 and the hole injection layer 42. In either case, where the organic semiconductor film 43 is formed in a box shape independently per pixel, or formed in a stripe shape along the data line "sig", this producing process in accordance with this embodiment can be applied only by forming the bank layer "bank" in a shape adapted thereto.

Liquid material(a precursor), for forming the organic semiconductor film 43, is injected into an inner region of the bank layer "bank" from an inkjet-head "IJ" to form the organic semiconductor film 43 in the inner region of the bank layer "bank". Similarly, liquid material (a precursor) for forming the hole injection layer 42 is injected into an inner region of the bank layer "bank" from the inkjet-head "IJ" to form the hole injection layer 42. As seen from the description presented above concerning the construction of the luminescent element with reference to FIGS. 7(A) and (B) and FIGS. 8(A) and (B), an order of steps to form the organic semiconductor film 43 and the hole injection layer 42 may be interchangeable depending on the structure.

Since the bank layer "bank" comprises the resist, the layer is water repellent. In contrast, since the precursors of the organic semiconductor film 43 and the hole injection layer 42 utilize a hydrophilic solvent, the coating region of the organic semiconductor film 43 is strictly defined by the bank layer "bank", and the region cannot extend off to an adjacent pixel. When the bank layer "bank" is formed at a sufficient height, the organic semiconductor film 43 or the hole injection layer 42 can be formed within a predetermined region by a coating method, such as a spin coating method, even if the ink jet method is not employed. In this embodiment, in order to improve the production efficiency in forming the organic semiconductor film 43 or the hole injection layer 42 by the ink jet method, as shown in FIG. 3, the forming regions of the organic semiconductor films 43 have the same inter-center pitch P between adjacent pixels 7 lying along the extending direction of the scanning line "gate". Therefore, as indicated in the arrow "Q", there is an advantage that the material of the organic semiconductor film 43, etc. can be injected by an ink jet head "IJ" simply with the same pitch along the extending direction of the scanning line "gate". The same pitch injection also simplifies a device for transferring the ink jet head "IJ" while facilitating the improvement of injection accuracy.

Figure 13G:
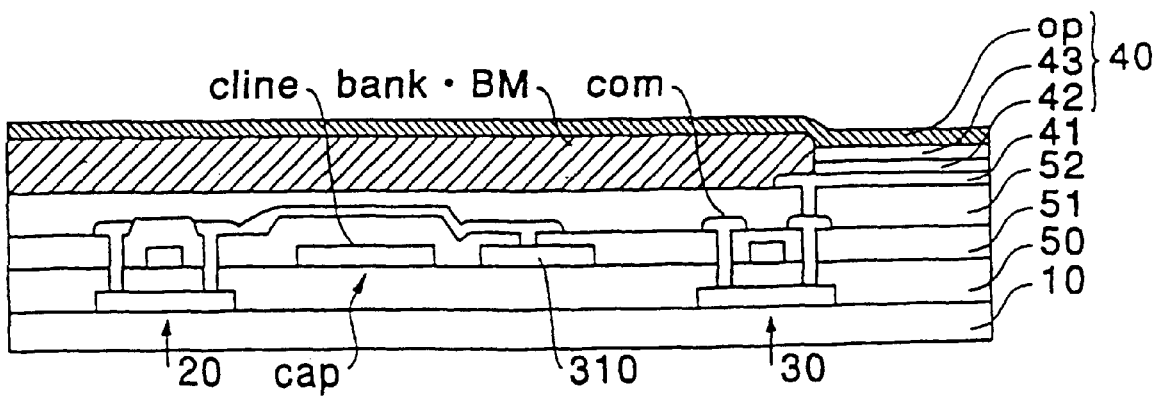

Afterward, as shown in FIG. 13(G), the opposite electrode "op" is formed on the front side of the transparent substrate 10. The opposite electrode "op" may be formed either on the entire surface or in a striped shape. In the latter, the patterning will be performed after the film is formed on the entire front side of the transparent substrate 10, and then patterning it into the striped shape.

The TFTs are also formed in the driving circuit at the data side 3 or the driving circuit at the scanning side 4, as shown in FIG. 1. This forming process of the TFTs employs all or a part of the steps for the TFT formation in the above described pixel 7. Therefore, the TFTs of the driving circuit are provided in the same inner-layer that the TFTs of the pixel 7 are formed in.

In this embodiment, since the bank layer "bank" comprises a black and insulating resist, the resist is left as it is to be utilized as a black matrix "BM" and an insulating layer for reducing a parasitic capacitance.

As shown in FIG. 1, the bank layer "bank" is also formed in the peripheral region of the transparent substrate 10 (hatched area in the figure). Hence, as the driving circuit at the data side 3 as well as the driving circuit at the scanning side 4 is overlaid by the bank layer "bank", the bank layer "bank" is disposed between the wiring layer of the driving circuit and the opposite electrode "op", even if the opposite electrode "op" and the forming regions of these driving circuits are overlapped. Therefore, the prevention of the driving circuits 3,4 from the parasitic capacitance can be achieved so as to reduce the load of the driving circuit at the data side 3, resulting in providing reduced electric consumption or speeding up the display operation.

In this embodiment, as shown in FIGS. 3 through 5, the bank layer "bank" is formed so as to overlap with the data line "sig". Thus, the bank layer "bank" is disposed between the data line "sig" and the opposite electrode "op", and consequently, it is possible to prevent the parasitic capacitance in the data line "sig". This results in the reduction of the load of the driving circuit, providing a reduction of the electric consumption or a speeding up of the display operation.

Further, in this embodiment, as shown in FIG. 3, FIG. 4 and FIG. 6(A), the bank layer "bank" is preferably also formed in the region where the pixel electrode 41 and the junction electrode 35 overlap. That is, as shown in FIG. 6(B), if the bank layer "bank" is not formed at the region where the pixel electrode and the junction electrode 35 overlap, even when the organic semiconductor film 43 emits light by the driving current across the pixel electrode 51 and the opposite electrode op, the light cannot be emitted and does not contribute to the display operation. This is because the light gets in between the junction electrode 35 and the opposite electrode "op". The driving current equivalent to the light, that does not contribute to the display operation, may be called an ineffective current with respect to display. In this embodiment, however, since the bank layer "bank" is formed in the region where the ineffective current is to flow to prevent the ineffective current, the waste current in the common power supply line "com" can be prevented. Hence, the width of the common power supply line "com" can be reduced accordingly.

As discussed above, if the bank layer "bank" that includes a black resist is reserved, the bank layer "bank" works as a black matrix to improve the display image quality, such as a luminance and a contrast ratio. That is, in the display apparatus according to this embodiment, since the opposite electrode "op" is formed in a striped shape on the entire surface, or on a broad region, of the front side of the transparent substrate 10, reflected light from the opposite electrode "op" reduces the contrast ratio. However, in this embodiment, since the bank layer "bank", which prevents the parasitic capacitance, includes a black resist, with the forming region of the organic semiconductor film 43 defined, there is an advantage that the bank layer "bank", working also as the black matrix, blocks useless light reflected from the opposite electrode "op", and it results in increasing the contrast ratio. Further, since the emitting region can be defined by self-alignment utilizing the bank layer "bank", a margin for alignment required for the emitting region is not necessary. This margin has been the problem when another metal layer, etc., is used as the black matrix instead of the bank layer "bank".

(Another Structure of the Active Matrix Substrate)

Figure 31:
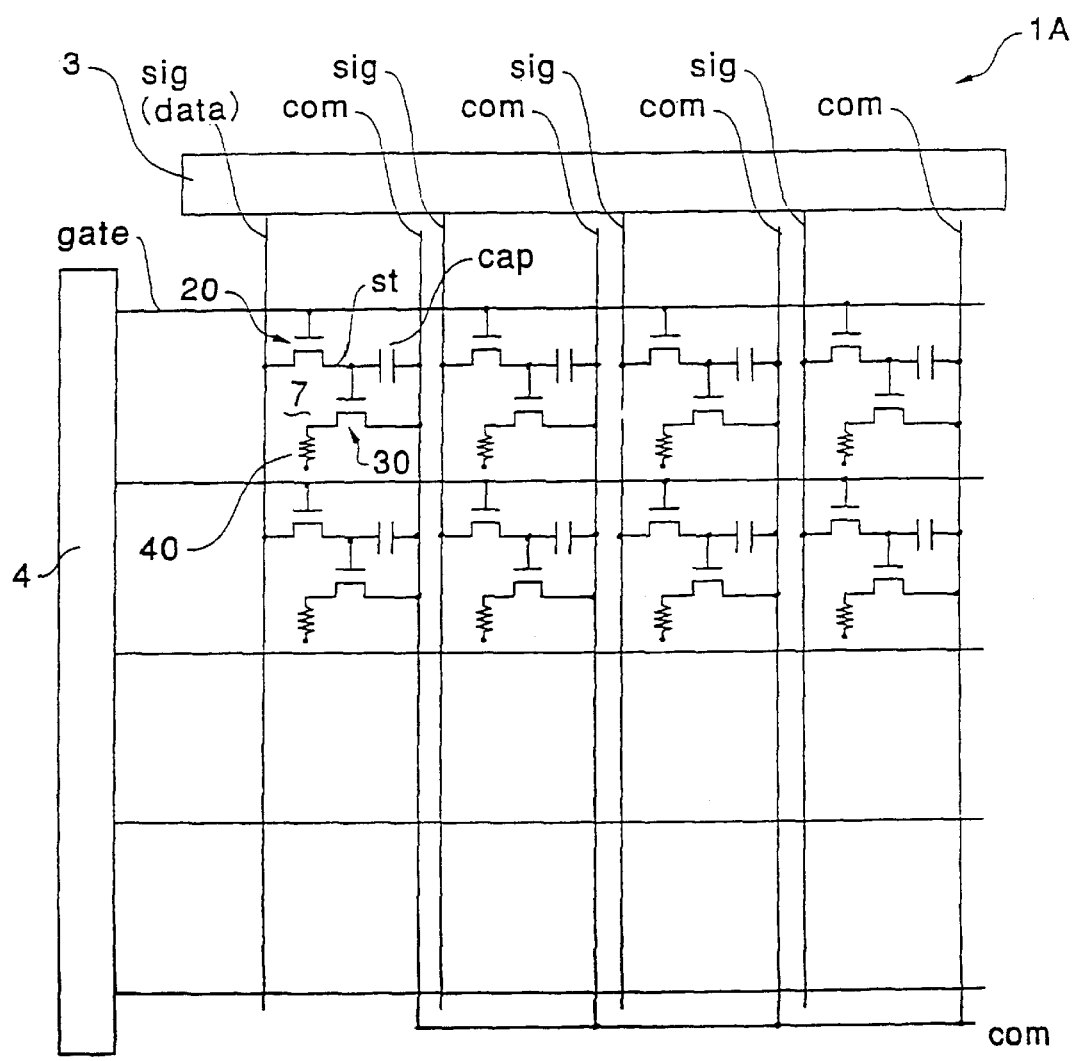
FIG. 31 is a block diagram of a display apparatus.
Figure 32:
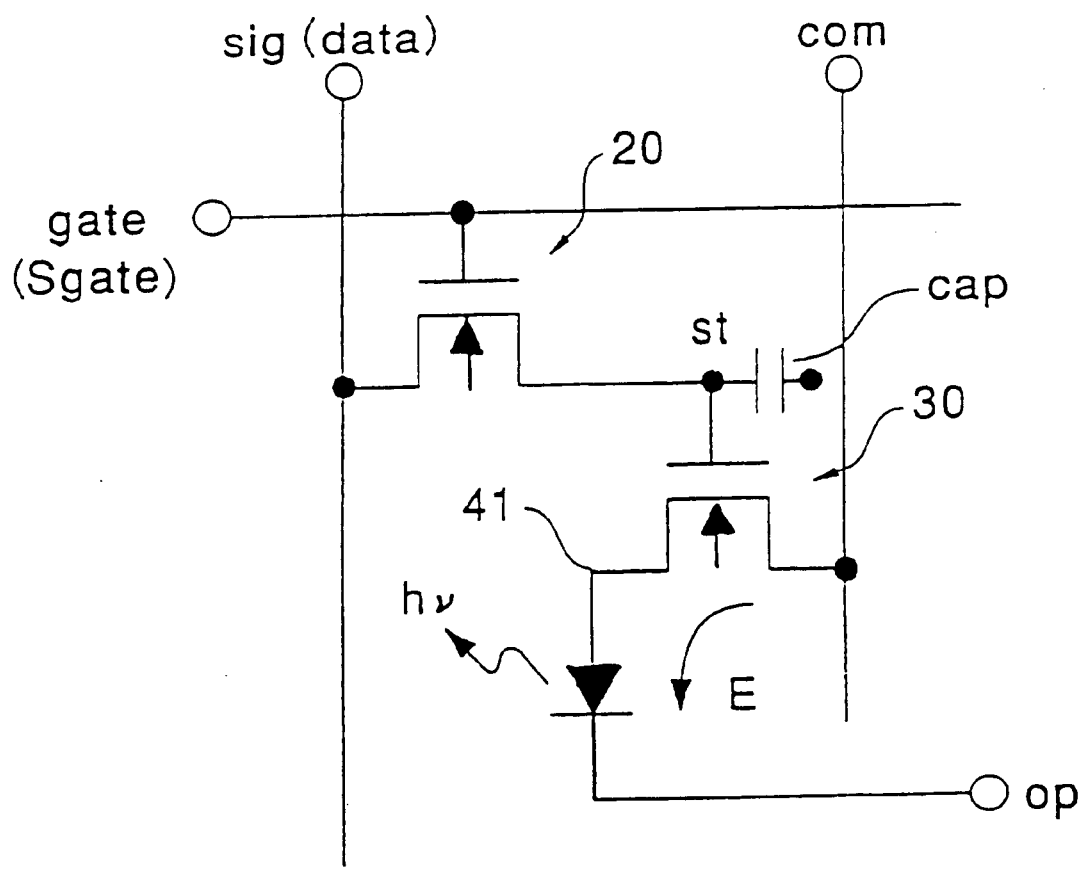
FIG. 32 is an equivalent circuit diagram illustrating a conventional pixel construction in the display apparatus shown in FIG. 31.
Figure 33A:
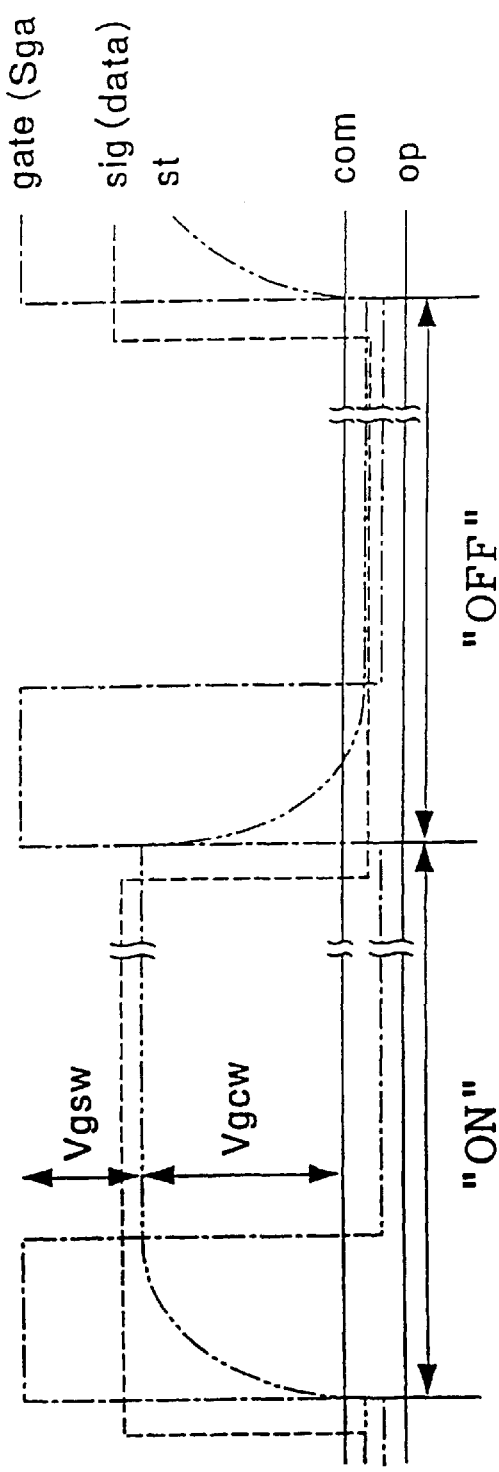
FIGS. 33(A) and (B) are a waveform chart indicating the signals to drive the pixel shown in FIG. 32, and a schematic representation indicating correspondences between these signals and the equivalent circuit, respectively.
Figure 33B:
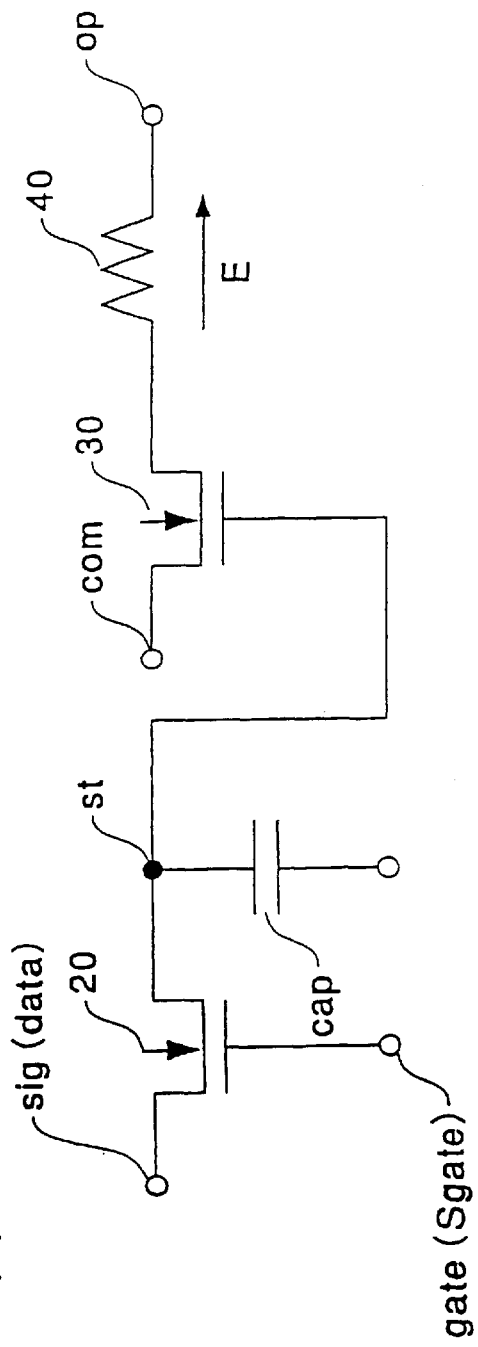

The present invention can be applied to various types of active matrix substrates as well as the above described structure. For example, the invention can be applied to the display apparatus 1A, wherein, as described in reference to FIG. 31, a unit comprising a data line "sig", a common power supply line "com" and a line of the pixels 7 is repeated in the direction of the scanning line "gate" on a transparent substrate 1.

Figure 14A:
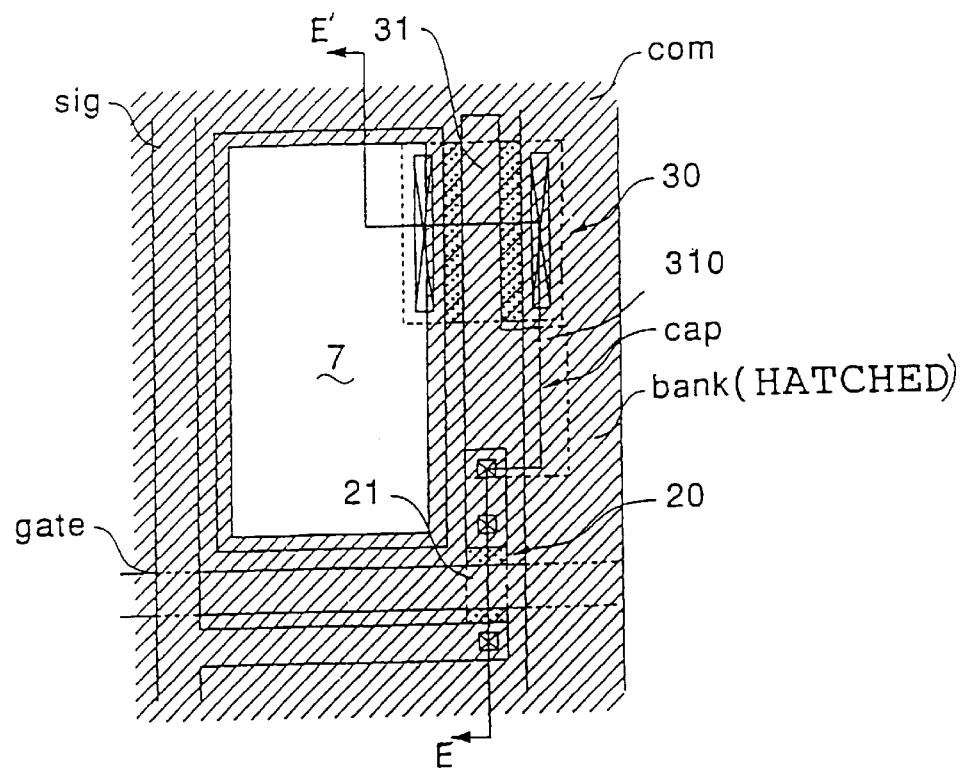
FIGS. 14(A) and (B) are respectively a plan view and a cross-sectional view of the pixels having a different structure from the pixels shown in FIGS. 3 through 6(B).
Figure 14B:
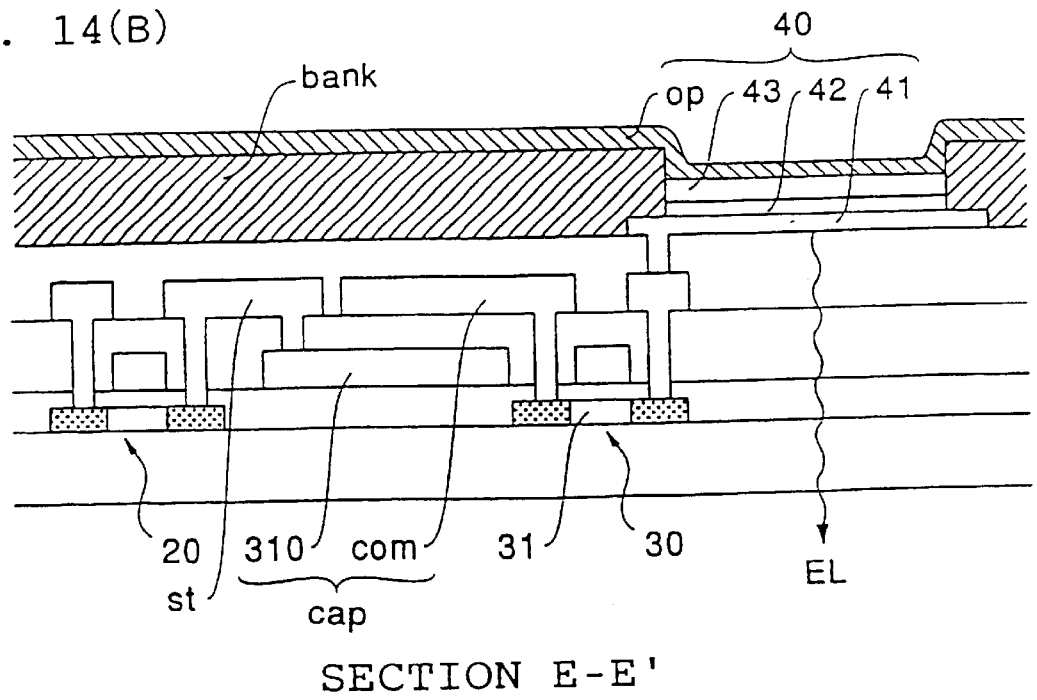

The holding capacitor "cap" may be formed between the common power supply line "com" and the potential-holding electrode "st" without the capacitor line. In this case, as shown in FIGS. 14(A) and (B), an extended portion 310 of the gate electrode 31 to connect electrically the potential-holding electrode "st" and the gate electrode 31, is expanded to the under-layer of the common power supply line "com" to form the holding capacitor "cap". This holding capacitor "cap" has the first inner-layer-insulation film 51 which is located between the extended portion 310 and the common power supply line "com" for a dielectric film.

As for the holding capacitor "cap" further, Figure is abbreviated, it may be formed utilizing a poly-silicon film for forming the TFT, and it also may be formed with the ahead scanning line other than the capacitor line and the common power supply line.

[Embodiment 1 for Carrying Out the Invention]

Figure 15:
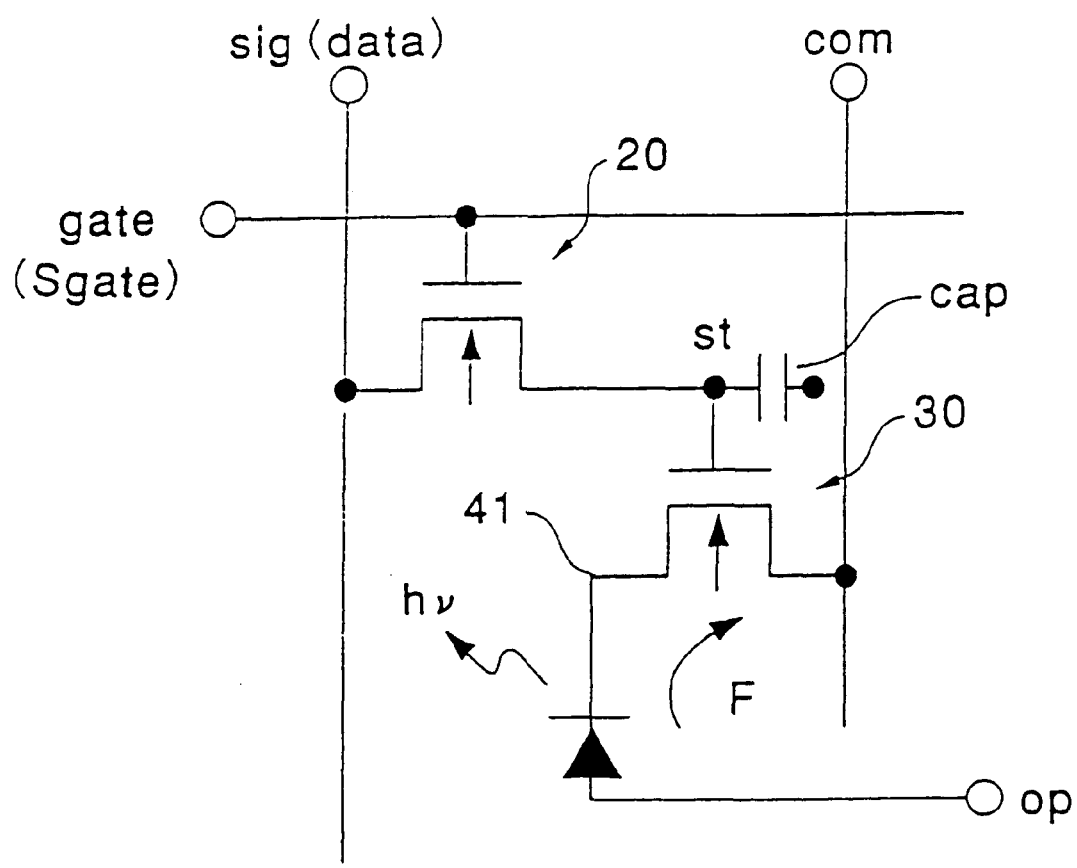
FIG. 15 is an equivalent circuit diagram illustrating a pixel structure of a display apparatus in accordance with Embodiment 1 of the present invention.
Figure 16A:
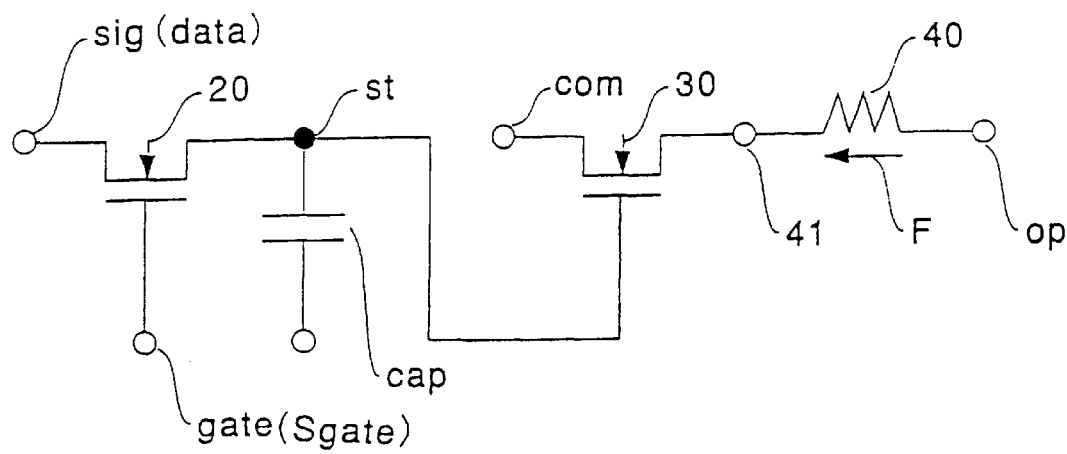
FIGS. 16(A) and (B) are a schematic representation indicating electrical connections of each element formed in the pixel shown in FIG. 15, and a waveform chart indicating potential changes in the driving signal, etc., respectively.
Figure 16B:
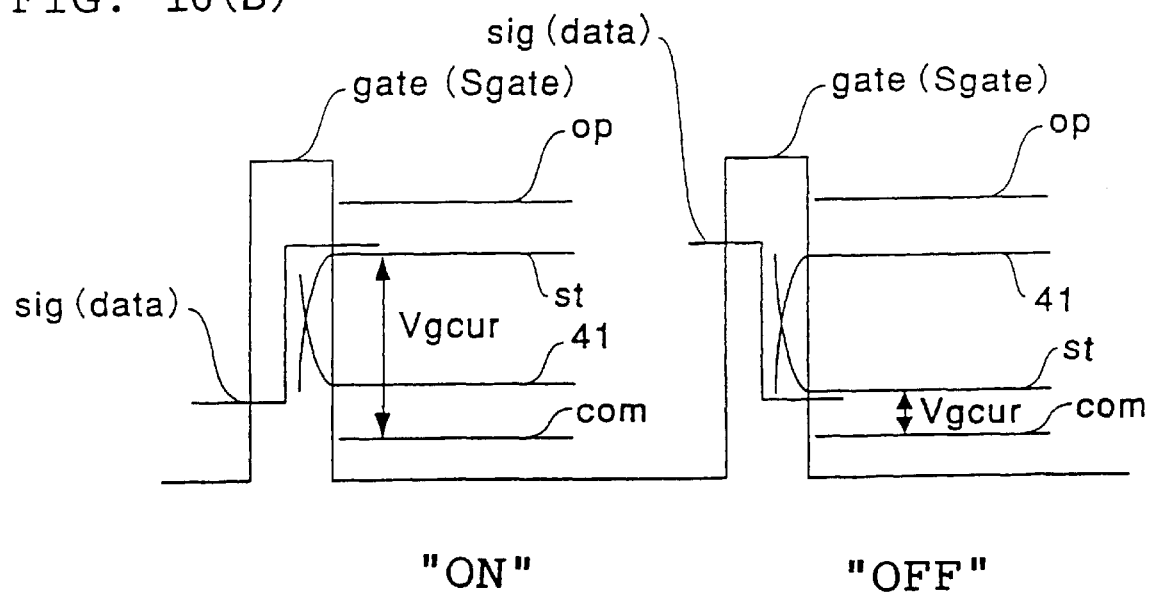

FIG. 15 is an equivalent circuit diagram showing the pixel structure in the display apparatus 1 in this embodiment. FIGS. 16(A) and (B) are a schematic representation showing electrical connections of each element formed in each pixel, and a wave form chart showing potential changes of driving signals and the like respectively.

In this embodiment, as shown in FIG. 15 and FIGS. 16(A) and (B), the first TFT 20 is of an N channel type. Accordingly, when the potential of the scanning signal "S gate" supplied from the scanning line "gate" becomes high, the first TFT 20 turns "on", and the image signal "data" is written into the holding capacitor "cap" from the data line "sig" through the first TFT 20. On the other hand, the potential of the scanning signal "Sgate" supplied from the scanning line "gate" is low, the second TFT is driven and controlled by the image signal "data" held by the holding capacitor "cap".

In this embodiment, the second TFT 30 is also of an N channel type. Therefore, from the data line "sig", the image signal "data" in the higher potential side is written into the holding capacitor "cap" of the pixel to be "on", while the image signal "data" in the lower potential side is written into the holding capacitor "cap" of the pixel to be "off". The electric potential of the potential-holding electrode "st" varies in response to this.

The gate voltage "V gcur" of the second TFT 30 corresponds to the potential difference between the potential-holding electrode "st" and the lower one of the common power supply line "com" and the pixel electrode 30. In this embodiment, the potential of the common power supply line "com" is maintained lower than the potential of the opposite electrode "op" of the luminescent element 40, such that when the second TFT 30 becomes "on", the current flows from the luminescent element 40 to the common power supply line "con", as shown by the arrow "F". Therefore, the gate voltage "V gcur" of the second TFT 30 corresponds to the potential difference between the common power supply line "com" and the potential-holding electrode "st". Contrarily to the potential of the pixel electrode 30, which corresponds to an intermediate potential between the common power supply line "com" and the opposite electrode "op", the potential of the common power supply line "con" can be set low enough. Therefore, in this embodiment, the gate voltage "V gcur" of the second TFT 30 can be maintained high enough and the "on" current of the second TFT 30 flows enough so that a display in a high luminance can be performed. If the gate voltage "V gcur" of the second TFT 30 can be high enough when the pixel is turned "on", the potential of the potential-holding electrode "st", i.e., the higher side potential of the image signals "data" can be lowered correspondingly. Accordingly, the amplitude of the image signals "data" can be reduced to decrease the driving voltage in the display apparatus 1.

In addition, although the "on" current of the second TFT 30 depends not only on the gate voltage "V gcur" but also on the drain voltage, the aforementioned conclusion does not change.

In this embodiment, the "on" current of the second TFT 30 is defined by the potential difference between the common power supply line "com" and the holding electrode "st", and is not affected by the potential of the opposite electrode "op" directly. Therefore, the higher side potential of the image signal "data" to turn the pixel "on" is lowered below the potential of the opposite electrode "op" to reduce the amplitude of the image signal "data", providing the reduced driving voltage in the display apparatus 1. The higher side potential of the image signal "data" to turn the pixel "on" may be lowered to the same potential of the opposite electrode "op" to reduce the amplitude of the image signal "data".

Further, in this embodiment, the potential of the image signal "data", which is supplied from the data line "sig" to the pixels to be turned "off", is set rather higher than the potential of the common power supply line "com". Since the second TFT 30 is of an N type, the gate voltage "V gcur" of the second TFT 30 is required to be negative (a lower potential than the common power supply line "com") to make it turn "off" completely. Or, the lower side potential of the image signal "data" is set rather high such that an absolute value of the gate voltage "V gcur" of the second TFT 30 becomes rather lower than an absolute value of a threshold voltage of the second TFT 30. At this time, in the pixel 7 which is in "off" state, the gate voltage of the second TFT 30 is set at the same polarity as the second TFT 30 which is turned "on", and is also set lower than the threshold voltage of the second TFT 30. At this time, even if the lower side potential of the image signal "data" is set rather high as discussed above, the flow of "on" current of the second TFT 30, being at the high resistance, is so small that the luminescent element 40 is kept "off". The potential of the image signal "data" supplied from the data line "sig" to the pixel to be "off" may be set the same as the potential of the common power supply line "com" to reduce the amplitude of the image signal "data".

Thus, when the lower side potential of the image signal "data" is set rather high, but in the order of not exceeding the threshold value, the amplitude of the image signal "data" can be reduced so that the driving voltage of the image signal "data" can be reduced. Further, as the higher side potential of the image signal "data" to turn the pixel "on" has been lowered below the potential of the opposite electrode "op", as mentioned above, the potential of the image signal "data" falls within the range defined by the opposite electrode "op" and the common power supply line "com". Therefore, the driving voltage in the display apparatus 1 can be reduced, and this results in lower electric power consumption in the display apparatus 1. This structure does not invite deterioration in the image quality, abnormality in performance and reduction of frequency enabling operation. There is also an advantage that a problem of withstanding voltage (the insulation resistance), which concerns each element formed by a thin film, is not encountered because of the reduced driving voltage in the display apparatus 1.

[A Modified Embodiment of Embodiment 1]

Figure 17:
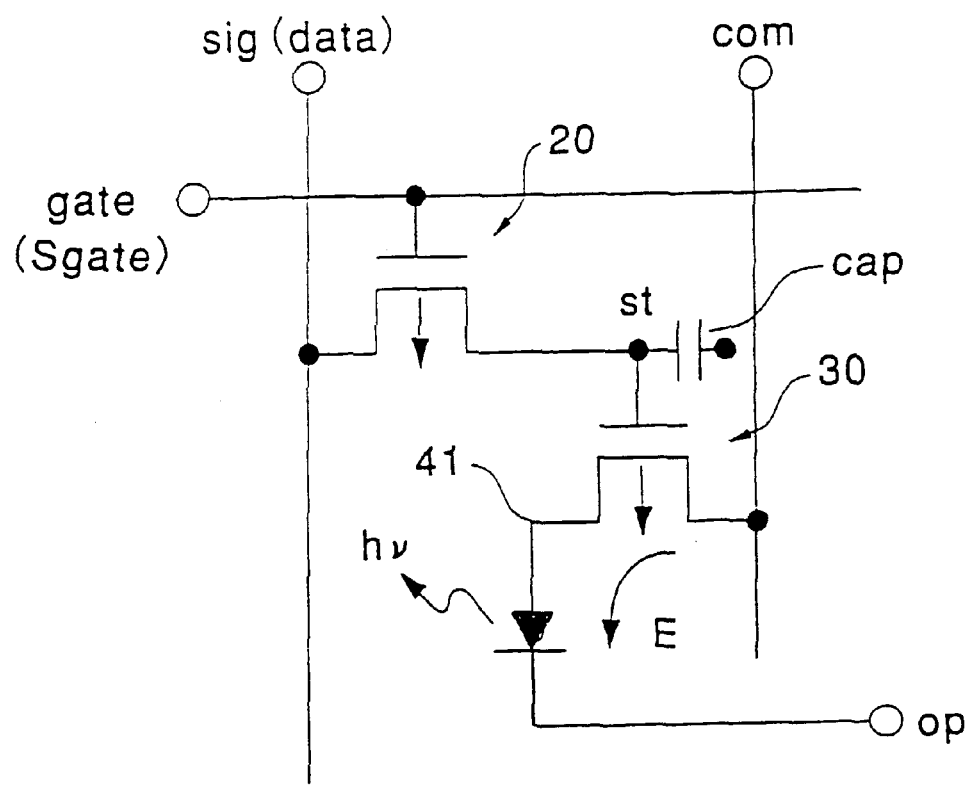
FIG. 17 is an equivalent circuit diagram illustrating a structure of a display apparatus in accordance with a modified Embodiment 1 of the present invention.
Figure 18A:
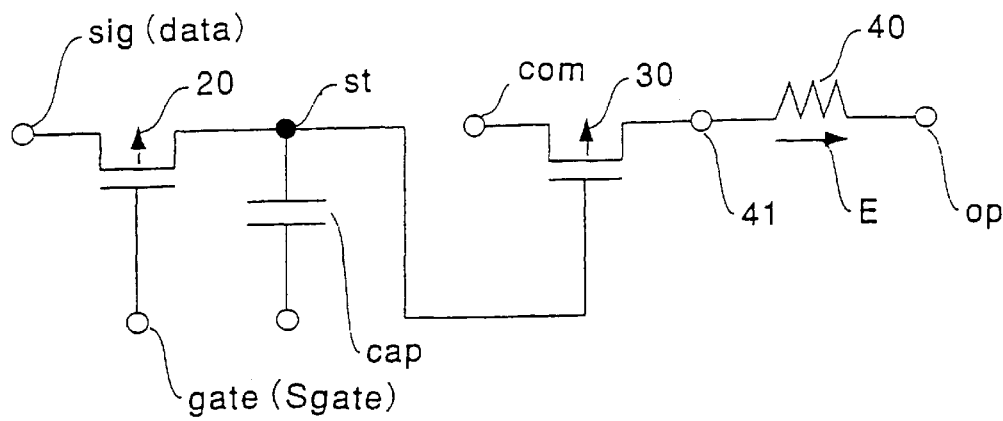
FIGS. 18(A) and (B) are a schematic representation indicating electrical connections of each element formed in the pixel shown in FIG. 17, and a waveform chart indicating potential changes in the driving signal, etc. respectively.
Figure 18B:
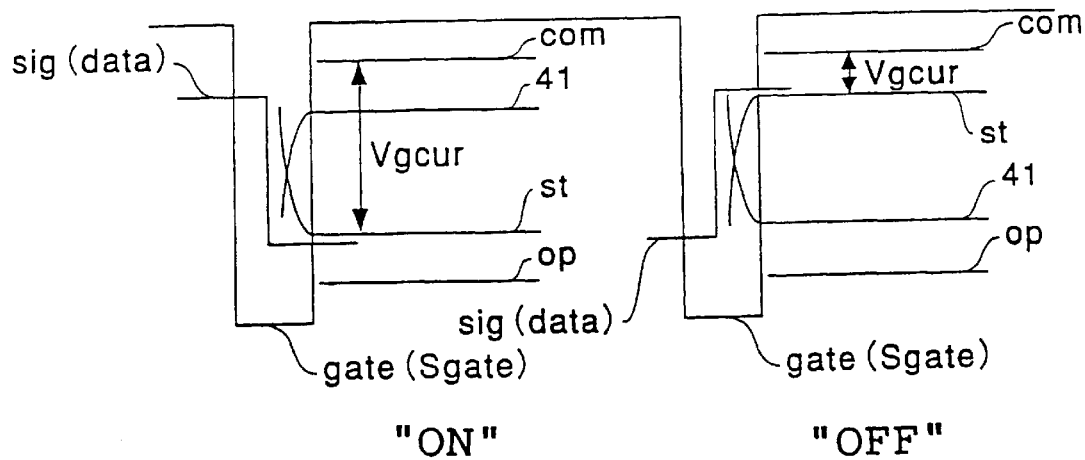

FIG. 17 is an equivalent circuit diagram showing the pixel structure in the display apparatus 1 of this embodiment. FIGS. 18(A) and (B) are a schematic representation showing electrical connections of each element formed in each pixel, and a wave form chart showing potential changes of the driving signals and like, respectively. In this embodiment, both the first and second TFT are formed with a P channel type, which is different from Embodiment 1. In this embodiment, however, each element is driven and controlled with the same technical idea as Embodiment 1 and the structure is same as Embodiment 1, except that the polarities of the driving signals described in Embodiment 1 are reversed. Therefore, the structure will be simply described.

As shown in FIG. 17 and FIGS. 18(A) and (B), since the first TFT 20 is of a P channel type in this embodiment, the first TFT 20 is "on" when the potential of the scanning signal supplied from the scanning line "Sgate" becomes low.

The second TFT 30 is also of a P channel type in this embodiment. Hence, from the data line "sig", the image signal "data" at the lower side potential is written into the holding capacitor "cap" of the pixel to be "on" state, while the image signal "data" at the higher side potential is written into the holding capacitor "cap" of the pixel to be "off" state.

The gate voltage "V gcur" at the second TFT 30 corresponds to the potential difference between the potential-holding electrode "st" and the higher one of the common power supply line "com" and the pixel electrode 30. In this embodiment, the potential of the common power supply line "com" is maintained higher than the potential of the opposite electrode "op" of the luminescent element 40, such that if the second TFT 30 becomes "on" state, the current flows from the common power supply line "com" to the luminescent element 40, as shown by the arrow "E". Therefore, the gate voltage "V gcur" of the second TFT 30 corresponds to the potential difference between the common power supply line "com" and the potential-holding electrode "st". The potential of the common power supply line "com" can be set high enough, different from the potential of the pixel electrode 30 which corresponds to an intermediate potential between the common power supply line "com" and the opposite electrode "op". Therefore, in this embodiment, the gate voltage "V gcur" of the second TFT 30 can be high enough so that the "on" current of the second TFT 30 is great, enabling a display in a high luminance. If the gate voltage "V gcur" of the second TFT 30 is high enough when the pixel is turned "on" state, the potential of the potential holding electrode "st", i.e., the lower side potential of the image signal "data" can be raised correspondingly such that the amplitude of the image signal "data" can be reduced.

In this embodiment, since the "on" current of the second TFT 30 is not affected by the potential of the opposite electrode "op" directly, the lower side potential of the image signal "data" to turn the pixel "on" is set rather higher than the potential of the opposite electrode "op" to reduce the amplitude of the image signal "data". In addition, the lower side potential of the image signal "data" to turn the pixel "on" may be raised to the same potential as the opposite electrode "op" to reduce the amplitude of the image signal "data".

Further, in this embodiment, the potential of the image signal "data" supplied from the data line "sig" to the pixel to be turned "off" is set rather lower than the potential of the common power supply line "com". This means that the higher side potential of the image signal "data" is set rather low, such that an absolute value of the gate voltage "V gcur" of the second TFT 30 becomes rather lower than an absolute value of the threshold voltage of this TFT. Therefore, the "on" current of the second TFT 30 becomes so small that the luminescent element 40 is turned "off". In addition, the potential of the image signal "data" supplied from the data line "sig" to the pixel to be turned "off" may be set at the same potential as the potential of the common power supply line "com" to reduce the amplitude of the image signal "data".

Thus, since the lower side potential of the image signal "data" is set rather high, and the higher side potential of the image signal "data" to turn the pixel "on" is set rather low, the potential of the image signal "data" falls within the range defined by the opposite electrode "op" and the common power supply line "com". Therefore, it is possible to obtain the same effects as Embodiment 1, such that the driving voltage in the display apparatus 1 can be reduced, enabling the electric power consumption to be reduced in the display apparatus 1, and so on.

[Embodiment 2 for Carrying Out the Invention]

Figure 19:
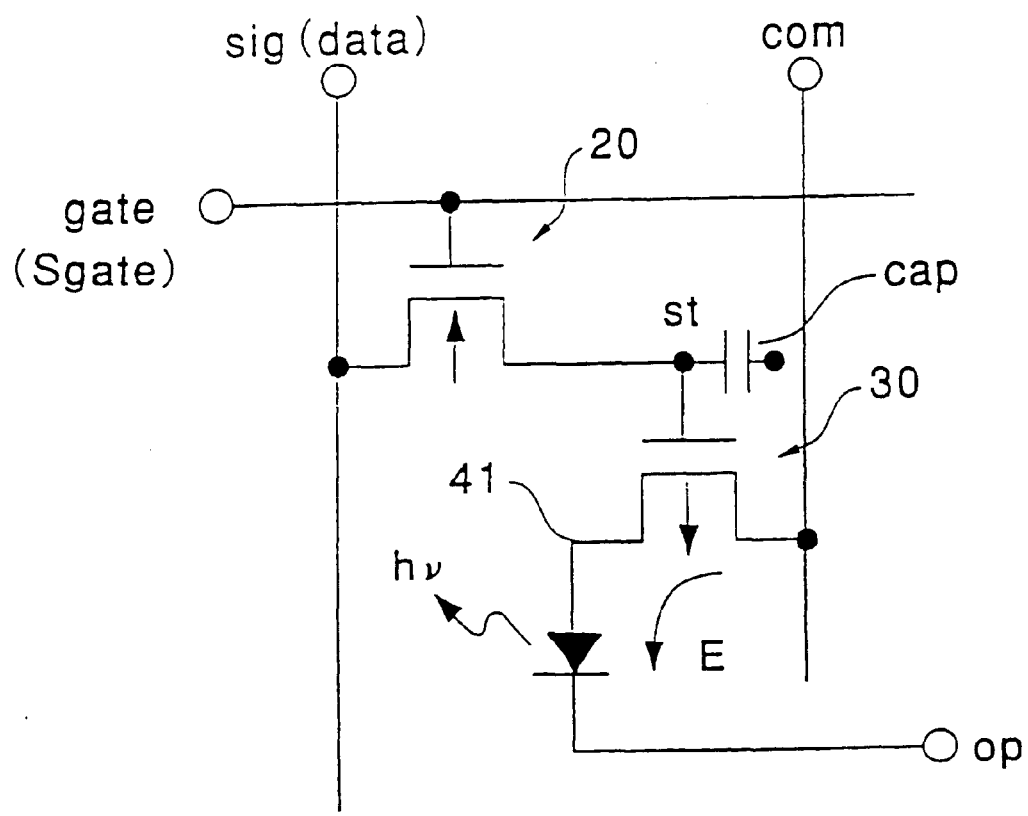
FIG. 19 is an equivalent circuit diagram illustrating a pixel structure of a display apparatus in accordance with Embodiment 2 of the present invention.
Figure 20A:
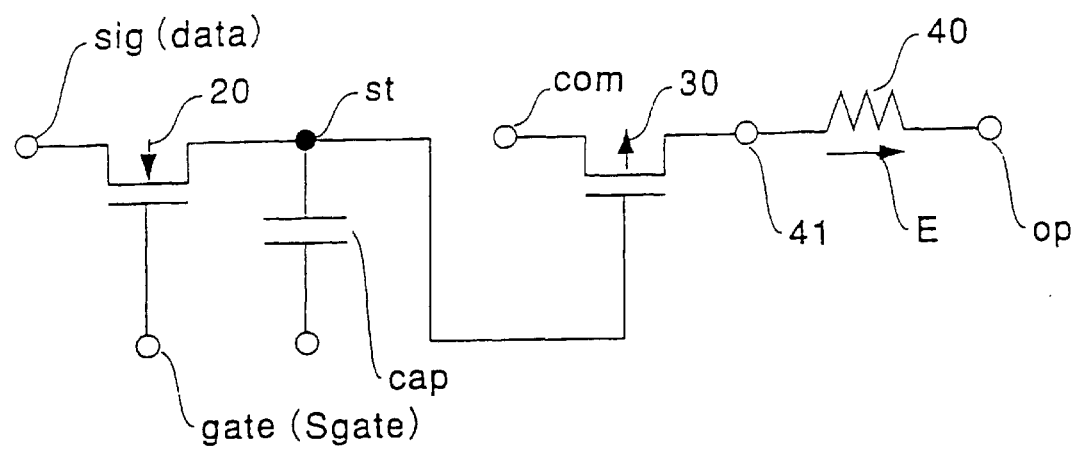
FIGS. 20(A) and (B) are a schematic representation indicating electrical connections of each element formed in the pixel shown in FIG. 19, and a waveform chart indicating potential changes in the driving signal, etc. respectively.
Figure 20B:
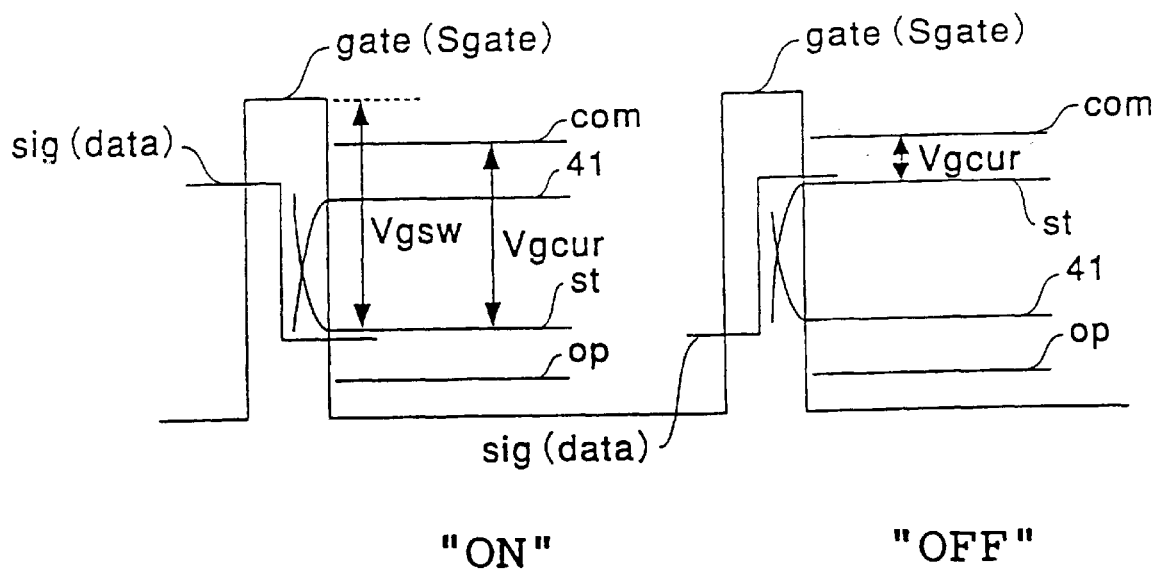

FIG. 19 is an equivalent circuit diagram showing the pixel structure in the display apparatus 1 of this embodiment. FIGS. 20(A) and (B) are a schematic representation showing electrical connections of each element formed in each pixel, and a wave form chart showing potential changes in the driving signal and the like, respectively. In this embodiment, as shown in FIG. 19 and FIGS. 20(A) and (B), the first TFT is formed with an N channel type and the second TFT is formed with a P channel type. Since the second TFT 20 is of a P channel type, from the data line "sig", the image signal "data" in the lower potential side is written into the holding capacitor "cap" of the pixel to be turned "on". The image signal "data" in the higher potential side is written into the holding capacitor "cap" of the pixel to be turned "off". The gate voltage "V gcur" of the second TFT 30 corresponds to the potential difference between the potential-holding electrode "st" and the higher one of the common power supply line "com" and the pixel electrode 30.

In this embodiment, the potential of the common power supply line "com" is set higher than the potential of the opposite electrode "op" of the luminescent element 40, such that the gate voltage "V gcur" of the second TFT 30 corresponds to the potential difference between the common power supply line "com" and the potential-holding electrode "st". The potential of the common power supply line "com" can be set higher enough compared with the potential of the pixel electrode 41, such that the "on" current of the second TFT 30 flows enough to achieve the display in a high luminance. And correspondingly, as the potential of the potential-holding electrode "st", i.e., the lower side potential of the image signal "data" can be raised, the amplitude of the image signal "data" can be reduced. In addition, as the "on" current of the second TFT 30 is not affected by the potential of the opposite electrode "op" directly, the lower side potential of the image signal "data" to turn the pixel "on" is raised higher than, or equal to, the potential of the opposite electrode "op" to reduce the amplitude of the image signal "data". Further, in this embodiment, the potential of the image signal "data" supplied from the data line "sig" to the pixel to be turned "off" is set rather lower than, or equal to, the potential of the common power supply line "com" to reduce the amplitude of the image signal "data". Therefore the potential of the image signal "data" falls within the range defined by the opposite electrode "op" and the common power supply line "com", and as a result the driving voltage in the display apparatus 1 is reduced. This results in lower power consumption, etc., in the display apparatus 1 the same as Embodiment 1 or modified Embodiment 1.

In this embodiment, since the first TFT 20 is of an N channel type, which is the opposite conductivity of the second TFT 30, the scanning line "gate" (the scanning signal "Sgate"), at the time of selecting the pixel, is at the higher potential. The gate voltage "Vgsw" of the first TFT 20 at this time corresponds to the potential difference between the scanning signal "Sgate" at the higher potential and the potential-holding electrode (the potential of the holding capacitor "st", the potential of the gate electrode of the second TFT 30). Since the second TFT 30 is of a P channel type, the image signal "data" to turn the pixel "on" is at the lower potential side and the potential of the potential-holding electrode "st" is decreasing during the selecting period of the pixel 7. Therefore, the gate voltage "Vgsw" of the first TFT 20 shifts toward increasing the "on" current.

On the other hand, the gate voltage "Vgcur" of the second TFT 30 corresponds to the potential difference between the common power supply line "con" and the potential-holding electrode "st". As the potential of the potential-holding electrode "st" tends to decrease during the selecting period when the selected pixel 7 is turned "on", the gate voltage "Vgcur" of the second TFT 30 shifts toward increasing the "on" current.

As mentioned above, in this embodiment, since the first TFT 20 is the opposite conduction type to the second TFT 30, the selecting pulse-height of the scanning signal "Sgate" is raised to increase a writing capacity of the first TFT 20, while the image signal "data" is decreased in order to reduce the "on" resistance of the second TFT 30, so as to increase a luminance of the luminescent element 40. These optimizations of selecting pulse-height of the scanning signal "Sgate" and the image signal "data" are effective at shifting the gate voltage of the first TFT 20 toward increasing the "on" current of the first TFT 20, in accordance with the image signals "data", which are at the level to turn the luminescent element 40 "on", are written into the holding capacitor "cap" during the selecting period of the pixel 7. Therefore, the image signal "data" from the data line "sig" is smoothly written into the holding capacitor "cap" through the first TFT 20. The gate voltage "Vgsw" of the first TFT 20 at the time of selecting the pixel element 7 corresponds to the potential difference between the scanning signal "Sgate" at the higher potential and the potential-holding electrode "st" (the potential of the holding capacitor "cap" or the potential of the gate electrode of the second TFT 30). The gate voltage "Vgcur" of the second TFT 30 corresponds to the potential difference between the common power supply line "com" and the potential-holding electrode "st". The potential of the scanning signal "Sgate" at the higher side and the potential of the common power supply line "com" are the same in polarity when using the potential of the potential-holding electrode "st" as a reference. Accordingly, if the potential of the potential-holding electrode "st" is changed, both the gate voltage "Vgsw" of the first TFT 20 and the "Vgcur" of the second TFT 30 correspondingly shift by the same amount in the same direction. Therefore, if the potential of the image signal "data" to turn "on" is changed toward reducing the "on" resistance of the first TFT 20 within the range of the driving voltage of the display apparatus 1, the higher display operation speed can be offered. At this time, since the potential of the image signal "data" to turn "on" is changed in the direction that the "on" resistance of the second TFT 30 is decreasing as a result, the luminance can be improved as well. This provides reduced driving voltage and improved quality of the display, simultaneously.

[A Modified Embodiment of Embodiment 2]

Figure 21:
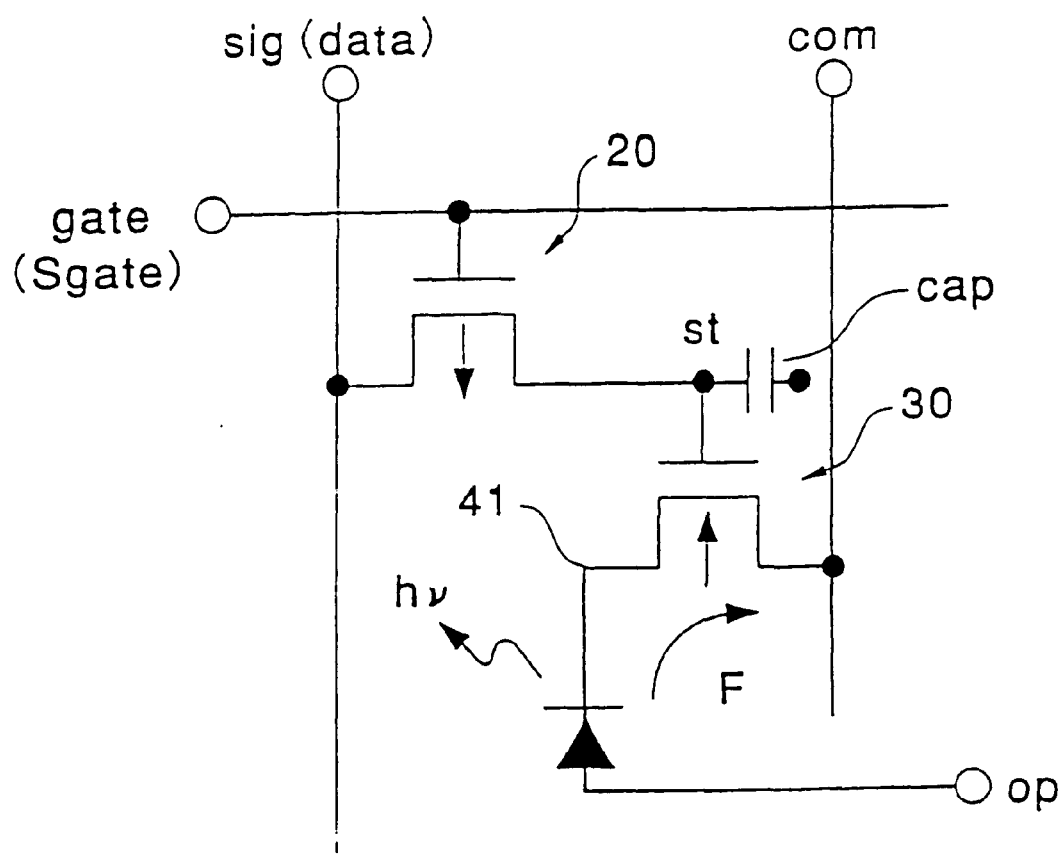
FIG. 21 is an equivalent circuit diagram illustrating a pixel structure of a display apparatus in accordance with a modified Embodiment 2 of the present invention.
Figure 22:
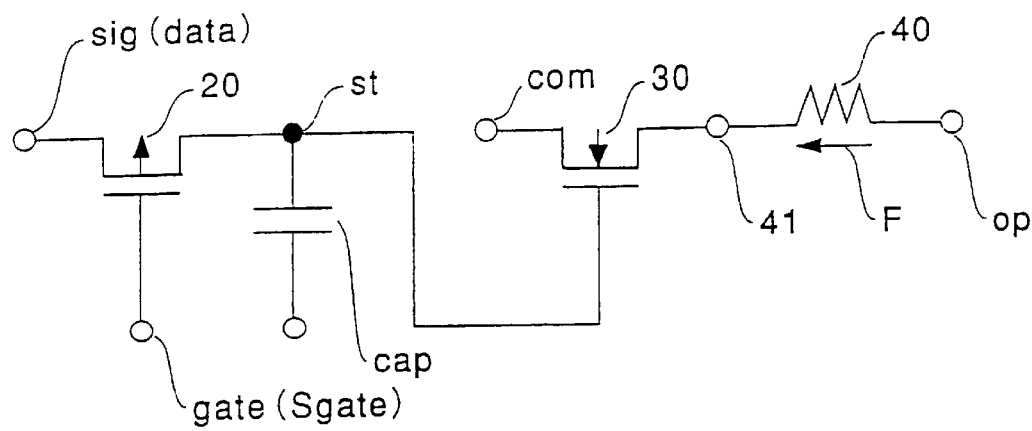
FIGS. 22(A) and (B) are a schematic representation indicating electrical connections of each element formed in the pixel shown in FIG. 21, and a waveform chart indicating potential changes in the driving signal, etc. respectively.
Figure 22:
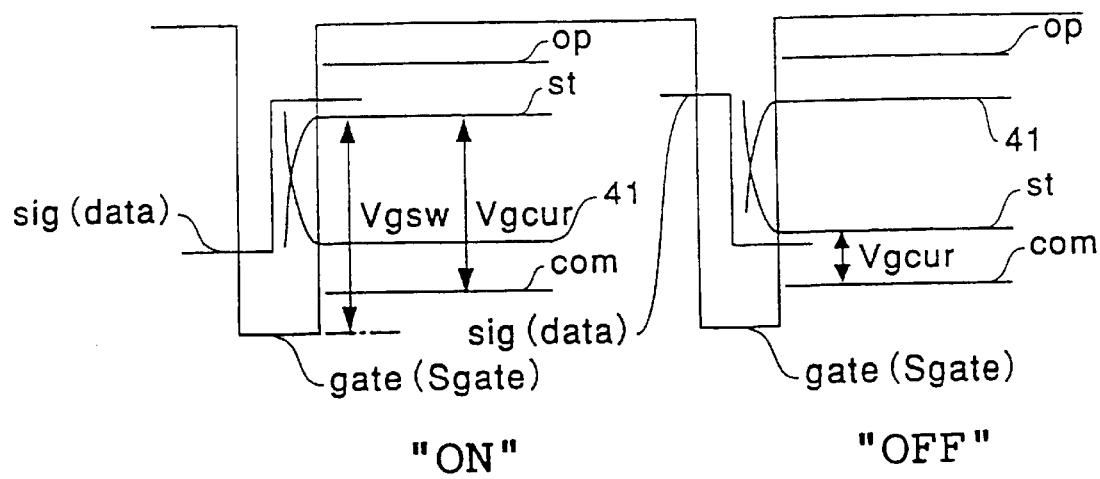

FIG. 21 is an equivalent circuit diagram showing the pixel structure in the display apparatus 1 of this embodiment. FIGS. 22(A) and (B) are a schematic representation showing electrical connections of each element formed in each pixel, and a wave form chart showing potential changes of the driving signal, and the like, respectively. In this embodiment, in contrast with Embodiment 2, the first TFT 20 is formed with a P channel type and the second TFT 30 is formed with an N channel type. However, in this embodiment, each element is driven and controlled with the same technical idea as Embodiment 2, except that the polarity of the driving signal described in Embodiment 2 is inverted. Accordingly, the structure will be simply described.

As shown in FIG. 21 and FIGS. 22(A) and (B), as in this embodiment, the second TFT 30 is of an N channel type like in Embodiment 1. From the data line "sig", the image signal "data" in the higher potential side is written into the holding capacitor "cap" of the pixel to be turned "on", while the image signal "data" in the lower potential side is written into the holding capacitor "cap" of the pixel to be turned "off". The gate voltage "V gcur" of the second TFT 30 corresponds to the potential difference between the potential-holding electrode "st" and the lower one of the common power supply line "com" and the pixel electrode 30. In this embodiment, since the potential of the common power supply line "com" is set lower than that of the opposite electrode "op" of the luminescent element 40, the gate voltage "V gcur" of the second TFT 30 corresponds to the potential difference between the common power supply line "com" and the potential-holding electrode "st". The potential of the common power supply line "com" can be set low enough that the "on" current of the second TFT 30 flows enough to achieve the display in a high luminance. The potential of the potential-holding electrode "st", i.e., the higher side potential of the image signal "data" can be raised by the increment of the luminance to reduce the amplitude of the image signal "data". And, since the "on" current of the second TFT 30 is not affected by the potential of the opposite electrode "op" directly, the higher side potential of the image signal "data" to turn the pixel "on" is set lower than, or equal to, that of the opposite electrode "op" so as to reduce the amplitude of the image signal "data". Further, in this embodiment, the potential of the image signal "data" supplied from the data line "sig" to the pixel to be "off" is set rather higher than, or equal to, that of the common power supply line "com" to reduce the amplitude of the image signal "data". Therefore, the potential of the image signal "data" falls within the range defined by the opposite electrode "op" and the common power supply line "com" to reduce the driving voltage in the display apparatus 1. This results in reducing the power consumption, etc., in the display apparatus 1, just as effectively as Embodiment 1 or modified Embodiment 1.

In this embodiment, as the first TFT 20 is of a P channel type, which is the opposite conductivity to the second TFT 30, the scanning line "gate" (the scanning signal "Sgate"), at the time of selecting the pixel, is at the lower potential. In contrast, as the second TFT 30 is of an N channel type, the image signal "data" to turn the pixel "on" is at the higher potential side.

As mentioned above, in this embodiment, since the first TFT 20 is of an opposite conductivity type to the second TFT 30, the potential of the selecting pulse of the scanning signal "Sgate" is set lower to increase the writing capacity of the first TFT 20. The potential of the image signal "data" is decreased to increase a luminance of the luminescent element 40 by reducing the "on" resistance of the second TFT 30. These optimizations, of the selecting pulse-height of the scanning signal "Sgate" and of the image signal "data", are effective at shifting the gate voltage of the TFT 20 toward increasing the "on" current of the first TFT 20, in accordance with the image signals "data" at the level to turn "on" the luminescent element 40 are writing into the holding capacitor "cap", during the period of selecting the pixel 7.

Accordingly, since the potential of the scanning signal "Sgate" at the lower side and the potential of the common power supply line "com" are the same in polarity when using the potential of the potential-holding electrode "st" as a reference, if the potential of the potential-holding electrode "st" is changed, the gate voltage "Vgsw" of the first TFT 20 and the gate voltage "Vgcur" of the second TFT 30 correspondingly shift by the same amount and in the same direction. Therefore, if the potential of the image signal "data" to turn "on" is changed toward reducing the "on" resistance of the first TFT 20 within the range of the driving voltage of the display apparatus 1, the display operation speed can be increased. Since the potential of the image signal "data" to turn "on" is changed toward reducing the "on" resistance of the second TFT 30 at the same time, a luminance can also be improved. This reduces driving voltage and improves the quality of the display simultaneously, just as in Embodiment 2. An optimized driving method in the above described Embodiment 2 and modified Embodiment 2 will be described with reference to FIG. 25.

Figure 25:
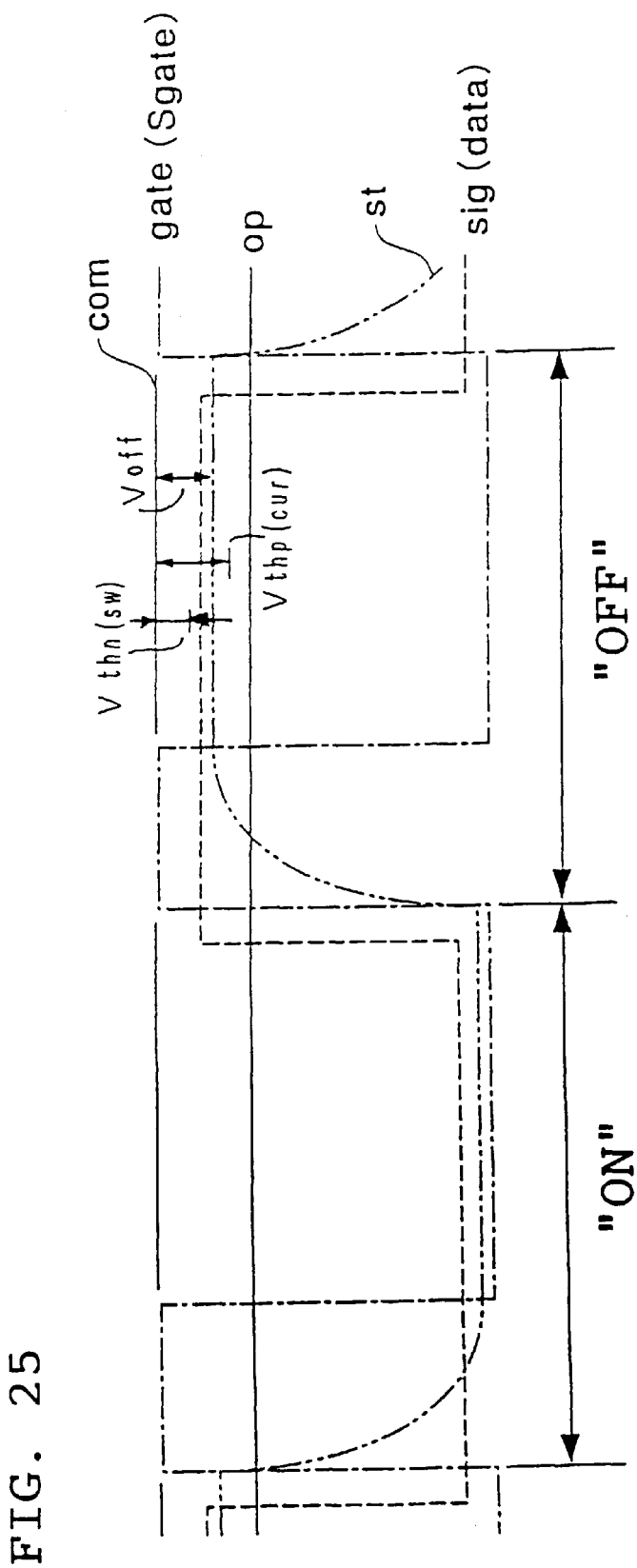
FIG. 25 is a waveform chart indicating the signals to drive the pixel of a display apparatus in accordance with Embodiment 2 of the present invention.

In Embodiment 2, the first TFT is of an N channel type and the second TFT is of a P channel type. As shown in FIG. 25, when the luminescent element 40 is turned "off", the potential of the image signal "data" is raised higher than the potential of the common power supply line "com" to turn "off" the P channel type second TFT 30. However, in this embodiment, even when the luminescent element 40 is turned "off", the second TFT 30 is not completely turned "off", as shown in FIG. 25. That is, since the second TFT is of a P channel type in this embodiment, in order to turn "off" the TFT completely, the gate voltage "Vgcur" is required to be 0 (the same potential as the potential of the common power supply line "com") or positive (higher than the common power supply line "con"). However, in this embodiment, the potential of the image signal "data" when the luminescent element is turned "off" is set at rather lower so that the gate voltage "Vgcur" of the second TFT 30 becomes rather higher than the threshold voltage "Vthp(cur)" of the TFT. Therefore, in the pixel 7 at the "off" state, the gate voltage applied across the second TFT 30 is the same in polarity as the second TFT 30 at the "on" state and is higher than the threshold voltage "Vthp(cur)" of the second TFT 30. For example, when the threshold voltage "Vthp(cur)" of the second TFT 30 is −4 V, the gate voltage applied across the second TFT 30 at the "off" state is set at −3 V.

In the case that the first TFT is of an N type and the second TFT is of a P type, if the potential of the image signal "data" at the "off" state is set rather lower than the conventional value, it is possible to reduce the voltage of the image signal "data" and increase the frequency because the amplitude of the image signal "data" can be reduced. Even when the potential of the image signal "data" at the "off" state is set rather low, the current at the "put-off" state is very small because in the P channel type second TFT 30, the potential is rather higher than the threshold voltage "Vthp(cur)". If the voltage applied across the luminescent element 40 is low enough, the driving current flowing into the element is very small. Accordingly, there are substantially no problems in turning "off" the luminescent element 40.

In this embodiment, if the potential of the image signal "data" at the "off" state is not required to be higher than the potential of the common power supply line "com", the potential of the common power supply line "com" can be set rather high. Thus, in this embodiment, the potential of the common power supply line "com" is set the same as the scanning signal "Sgate" to turn the first TFT "on". Therefore, the signal level, which is used as the higher potential of the scanning signal "Sgate" in the driving circuit at the scanning side, can be supplied, as it is, to the common power supply line "com". Thus, the number of the driving signal levels in use in the display apparatus 1 of this embodiment can be reduced to decrease the number of terminals to be input the driving signal in the display apparatus 1. Further, the number of power supplies can also be reduced to decrease the power consumption and reduce the space required.

In this case, since the first TFT 20 is of an N channel type and the second TFT 30 is of a P channel type, the potential of the gate electrode applied across the second TFT 30 of the pixel 7 at "off" state is set lower than the potential obtained by subtracting the threshold voltage "Vthn(sw)" at the first TFT 20 from the potential of the scanning signal "gate" to turn the first TFT 20 "on" state. That is, it is preferable that an absolute value of the potential difference "Voff" between the image signal "data" at turning the pixel 7 "off" state (the potential of the potential-holding electrode "st") and the common power supply line "com" is to be set higher than the threshold voltage "Vthn(sw)" of the first TFT 20, as shown in a formula below, to prevent troubles in the writing operation for the first TFT 20 when selecting the pixel 7.

$$Vthn(sw) < |Voff|$$

In the case of the modified Embodiment 2 where the first TFT 20 is of a P channel type and the second TFT 30 is of an N channel type, as will be described later with reference to FIG. 26 and FIGS. 27(A) and (B), the polarities of voltages applied across the first TFT 20 and the second TFT 30 are inverted by interchanging the relative values of each signal described in Embodiment 2. In this case, if the second TFT 30 is not completely turned "off" to turn "off" the luminescent element 40, the reduction of voltage and the increase of frequency of the image signal "data" can be achieved the same as Embodiment 2. If the potential of the common power supply line "com" is set equal to the scanning signal "Sgate" to turn the first TFT 20 "on" state, the number of power supplies can be reduced. In this case, in order to avoid troubles in the writing operation of the first TFT 20 when selecting the pixel 7, the potential of the gate electrode applied across the second TFT 30 of the pixel 7 at "off" state is set higher than the potential obtained by addition the potential of the scanning signal "Sgate" to turn the first TFT 20 "on" state to the threshold voltage "Vthn(sw)" of the first TFT 20.

[Embodiment 3 for Carrying Out the Invention]

Figure 23:
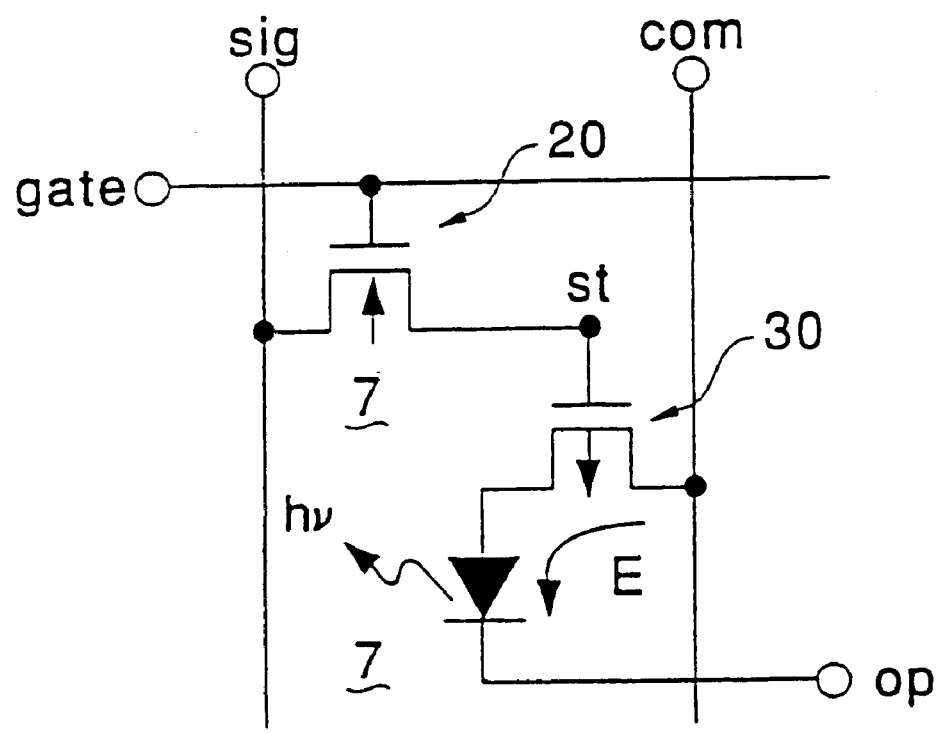
FIG. 23 is an equivalent circuit diagram illustrating a pixel structure of a display apparatus in accordance with Embodiment 3 of the present invention.

As shown in the FIG. 23 illustrating an equivalent circuit diagram, this embodiment is an example of structures where the first TFT 20 is of an N channel type and the second TFT 30 is of a P channel type in any pixel 7 the same as Embodiment 2. In the display apparatus 1 according to this embodiment, the potential of the common power supply line "com" is set higher than the potential of the opposite electrode "op" of the luminescent element 40 because the second TFT 30 is of a P channel type. When the second TFT 30 is turned "on", the current flows from the common power supply line "com" to the luminescent element 40, as illustrated by the arrow "E". Since this embodiment is similar to Embodiment 2, only the differences will be described, and the things in common will be omitted. This embodiment is different from Embodiment 2 in that the holding capacitor "cap" is omitted. By this structure, the potential changes of the potential-holding electrode "st" can become larger.

In the case where the first TFT 20 is of a P channel type and the second TFT 30 is of an N channel type, as will be described later with reference to FIG. 26 and FIGS. 27(A) and (B), the polarities of voltages applied to the first TFT 20 and the second TFT 30 are inverted by interchanging the relative values of each signal described in that embodiment. Also, in this case, the potential of the selecting pulse of the scanning signal is set lower to increase a writing capacity of the first TFT 20. The potential of the image signal is raised to raise an emitting luminance by reducing the "on" resistance of the second TFT 30.

[A Modified Embodiment 3]

Figure 26:
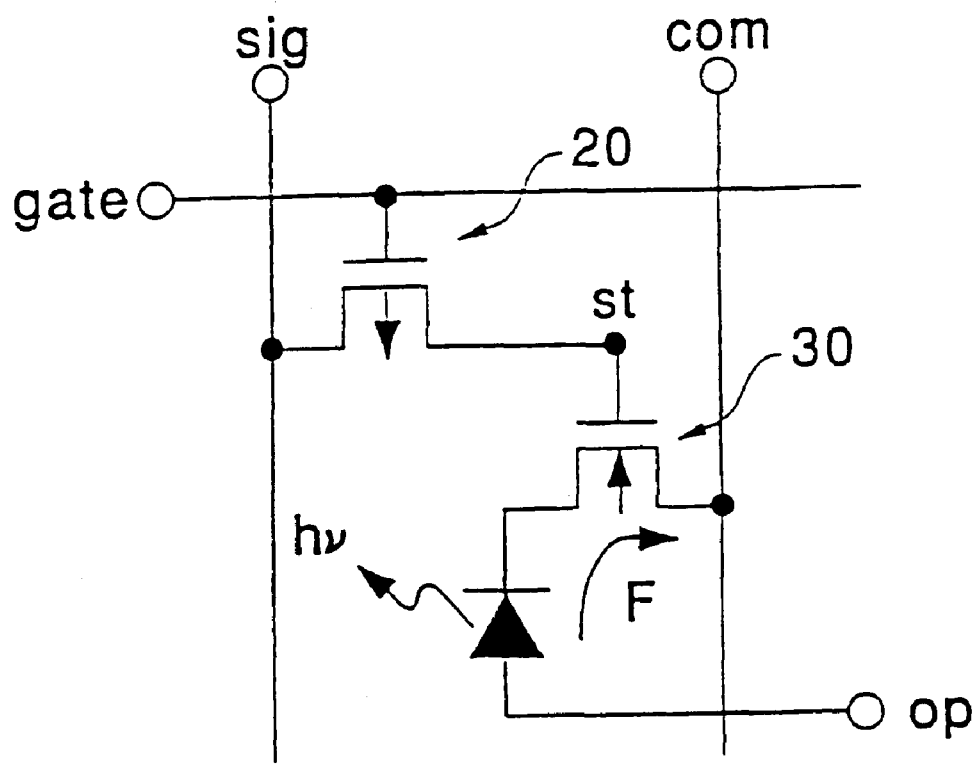
FIG. 26 is an equivalent circuit diagram illustrating a pixel structure of a display apparatus in accordance with a modified Embodiment 3 of the present invention.

In Embodiment 3 described above, the first TFT 20 is of an N channel type and the second TFT 30 is of a P channel type in any pixel 7, however a structure where the first TFT 20 is of a P channel type and the second TFT 30 is of an N channel type may also be possible, as shown in the FIG. 26 illustrating an equivalent circuit diagram. In the exemplary structure shown in the figure, the potential of the common power supply line "con" is set lower than the potential of the opposite electrode "op" of the luminescent element 40, such that when the second TFT 30 is turned "on", the current flows from the opposite electrode "op" of the luminescent element 40 to the common power supply line "com" as illustrated by the arrow "F".

Figure 24A:
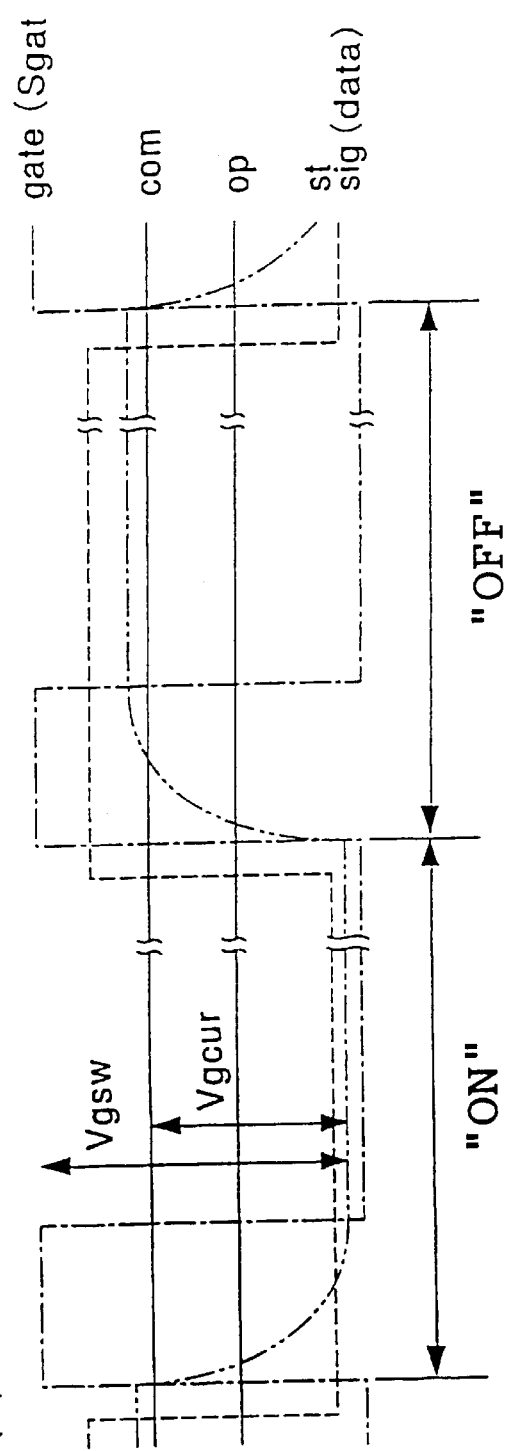
FIGS. 24(A) and (B) are a waveform chart indicating the signals to drive the pixel shown in FIG. 23, and a schematic representation indicating correspondences between these signals and the equivalent circuit, respectively.
Figure 24B:
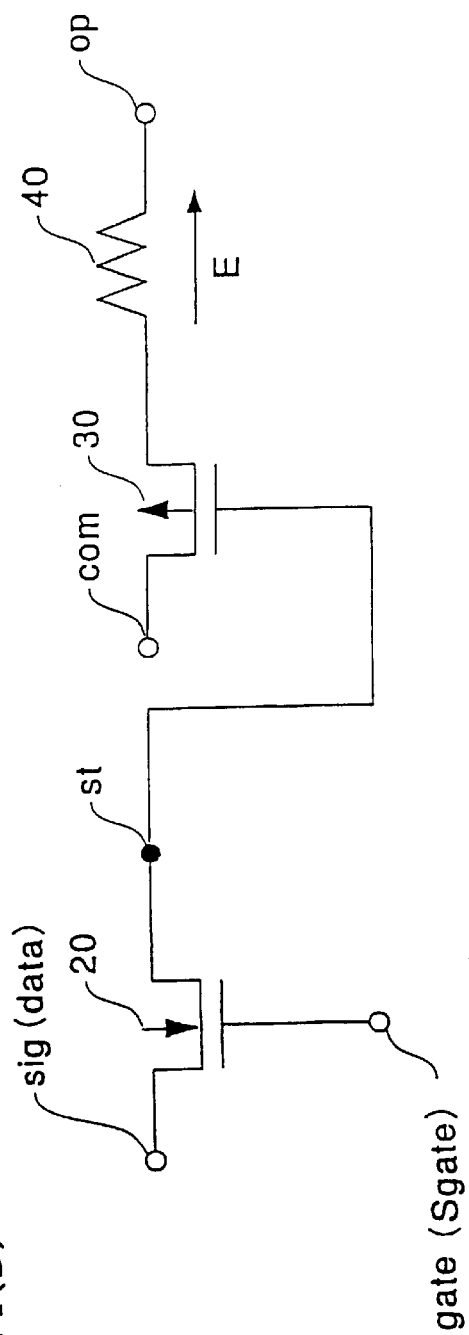
Figure 27A:
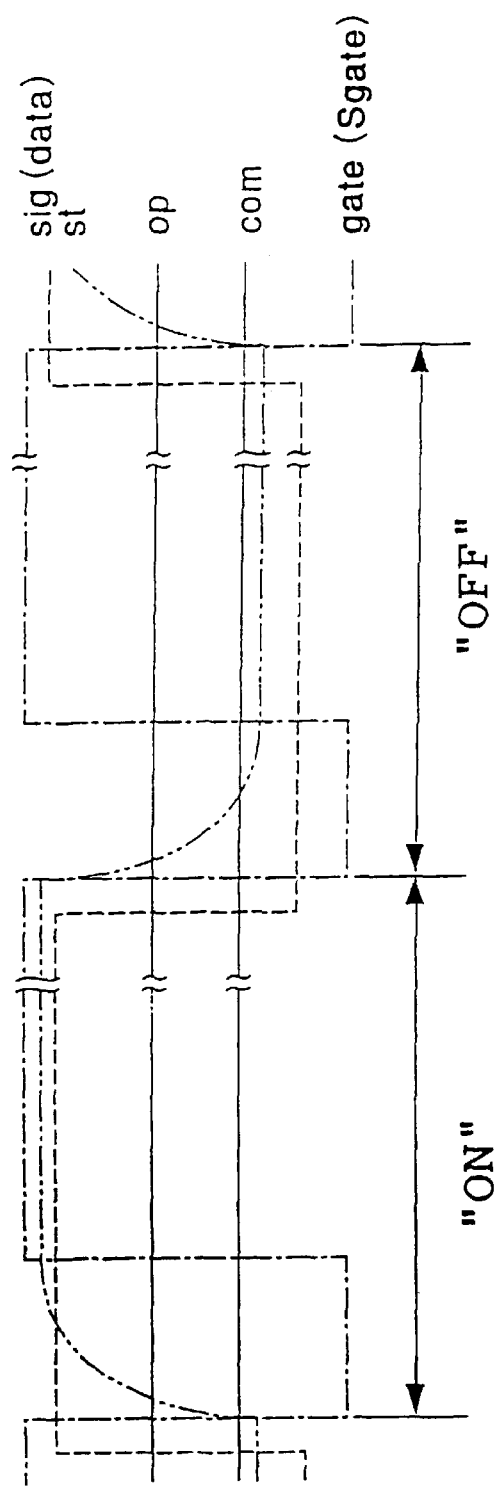
FIGS. 27(A) and (B) are a waveform chart indicating the signals to drive the pixel shown in FIG. 26, and a schematic representation indicating correspondences between these signals and the equivalent circuit, respectively.
Figure 27B:
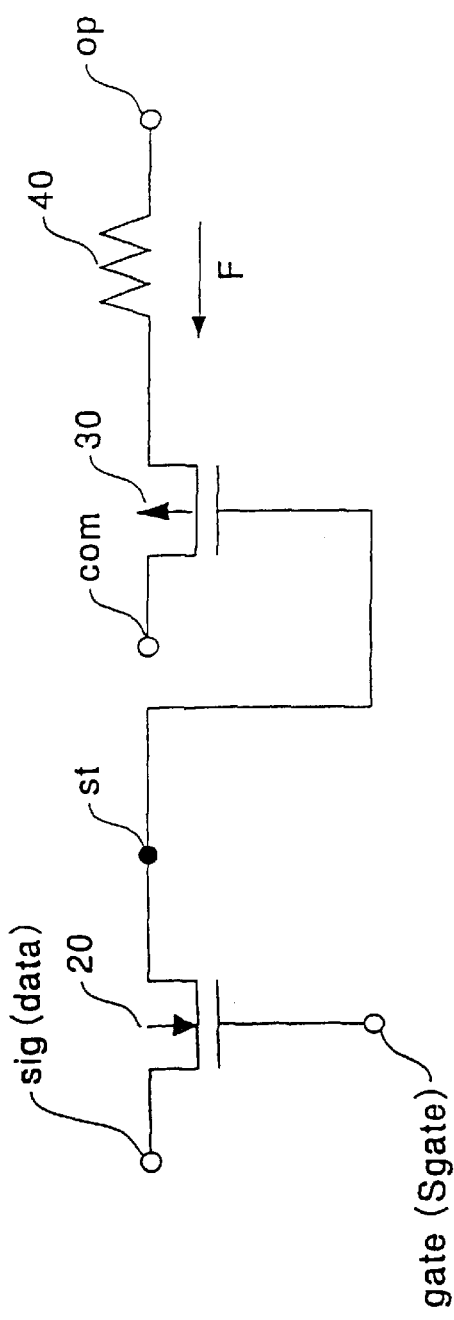

In this structure of the pixel 7, as shown in FIGS. 27(A) and (B), the polarity of each driving signal, which has the wave-shapes shown in FIG. 24(A), is inverted.

In Embodiment 3, where the first TFT 20 is of an N channel type and the second TFT 30 is of a P channel type, the potential of the common power supply line "con" may be set lower than the potential of the opposite electrode "op" of the luminescent element 40, such that the current flows from the opposite electrode "op" of the luminescent element 40 to the common power supply line "com" when the second TFT 30 is turned "on". Even in this structure, the advantages, which are obtained by forming the first TFT 20 and the second TFT 30 to have an opposite conductivity, are also obtained. In contrast to this situation, namely, when the first TFT 20 is of a P channel type and the second TFT 30 is of an N channel type, the potential of the common power supply line "com" may be set higher than the opposite electrode "op" of the luminescent element 40, such that the current flows from the common power supply line "com" to the luminescent element 40 when the second TFT 30 is turned "on", and the advantages obtained by the opposite conductivity of the first TFT 20 and second TFT 30 are also obtained.

[Embodiment 4 for Carrying Out the Invention]

Figure 28A:
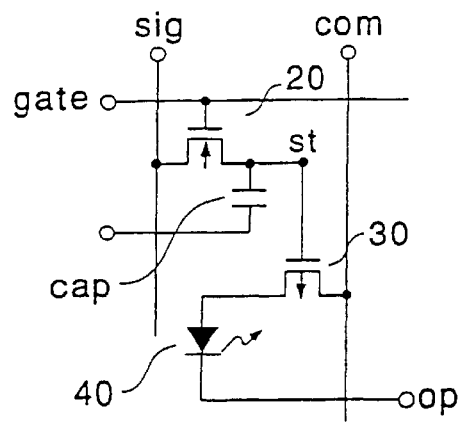
FIGS. 28(A) and (B) are an equivalent circuit diagram illustrating a pixel of a display apparatus in accordance with Embodiment 4 of the present invention, and a waveform chart indicating the signals to drive the pixel, respectively.

In any of Embodiments 1, 2 and 3, as will be described with reference to FIGS. 28(A) and (B), it may be formed such that a pulse is supplied with one of electrodes of the holding capacitor "cap". The electrode receiving the pulse is opposite to the other, which is electrically connected to the gate electrode of the second TFT 30. The potential of this pulse is opposite to the selecting pulse of the scanning signal "gate", and the pulse is supplied the electrode with a delay behind the selecting pulse.

In this example, as shown in FIG. 28 (A), one of both of the electrodes of the holding capacitor "cap", which is opposite to the one, which is electrically connected to the gate electrode of the second TFT 30 through the potential-holding electrode "st", is formed by the capacitor line "cline", which is extended in parallel with the scanning line "gate".

Figure 28B:
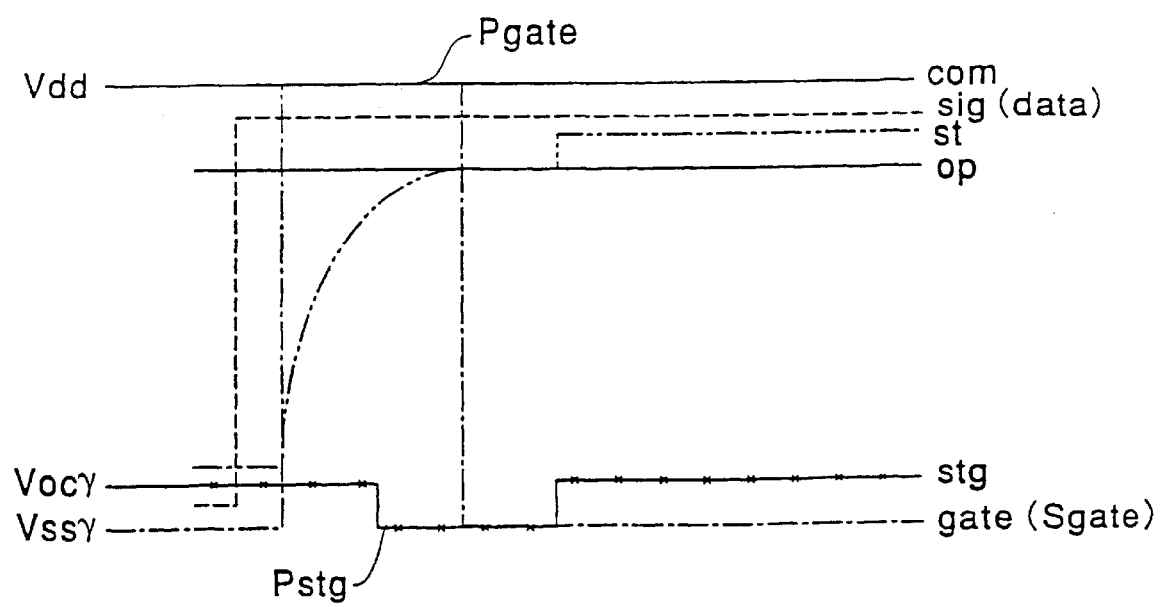

As shown in FIG. 28(B), this capacitor line "cline" is formed such that the potential "stg" is supplied to the capacitor line "line" with a delay behind the selecting pulse "Pgate" of the scanning signal "Sgate". The potential "stg" supplied to the capacitor line "cline" includes the pulse signal "Pstg", and the polarity of which is opposite to the polarity of the selecting pulse.

After the selecting pulse becomes non-selective, the pulse signal "Pstg" shifts the potential of the image signal "data" utilizing a capacitive coupling of the holding capacitor "cap". Therefore, signals are held in the holding capacitor "cap" at the "off-state" pixel 7, corresponding to the potential obtained by adding the potential of the pulse signal "Pstg" to the potential of the image signal "data". Due to the high "on" resistance of the first TFT 20, it is difficult to completely write the signals in the higher potential side of the image signals "data" within a limited time. In the case of the example, a shortage of the writing capacity results in no emitting of the pixel. However, in accordance with Embodiment 4, it is possible to supplement the writing of the image signal "data" to the holding capacitor "cap", even though the maximum range of the potential in the driving signal is not expanded.

Figure 29:
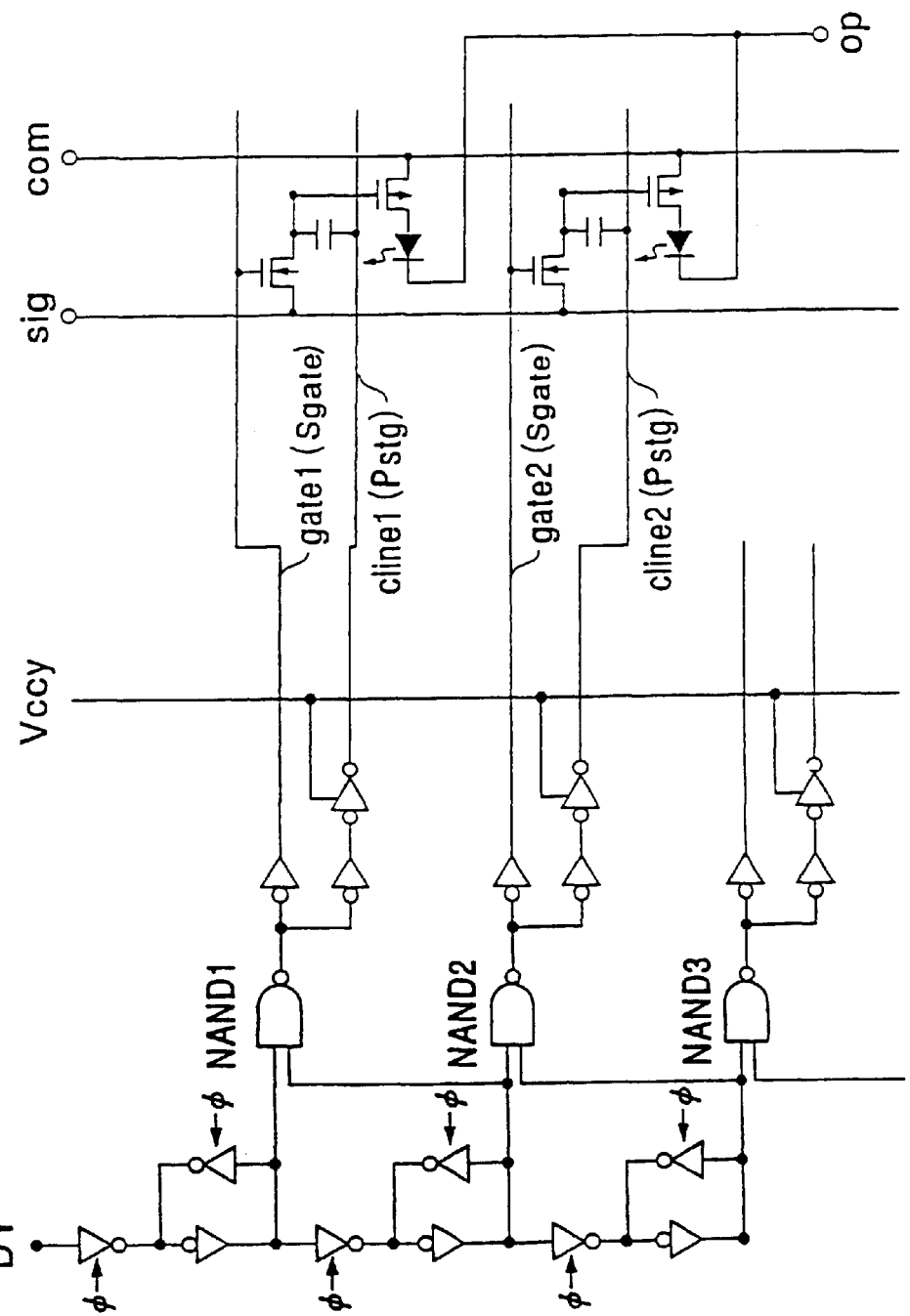
FIG. 29 is a block diagram of the driving circuit at the scanning side to generate the signals shown in FIG. 28(B).
Figure 30:
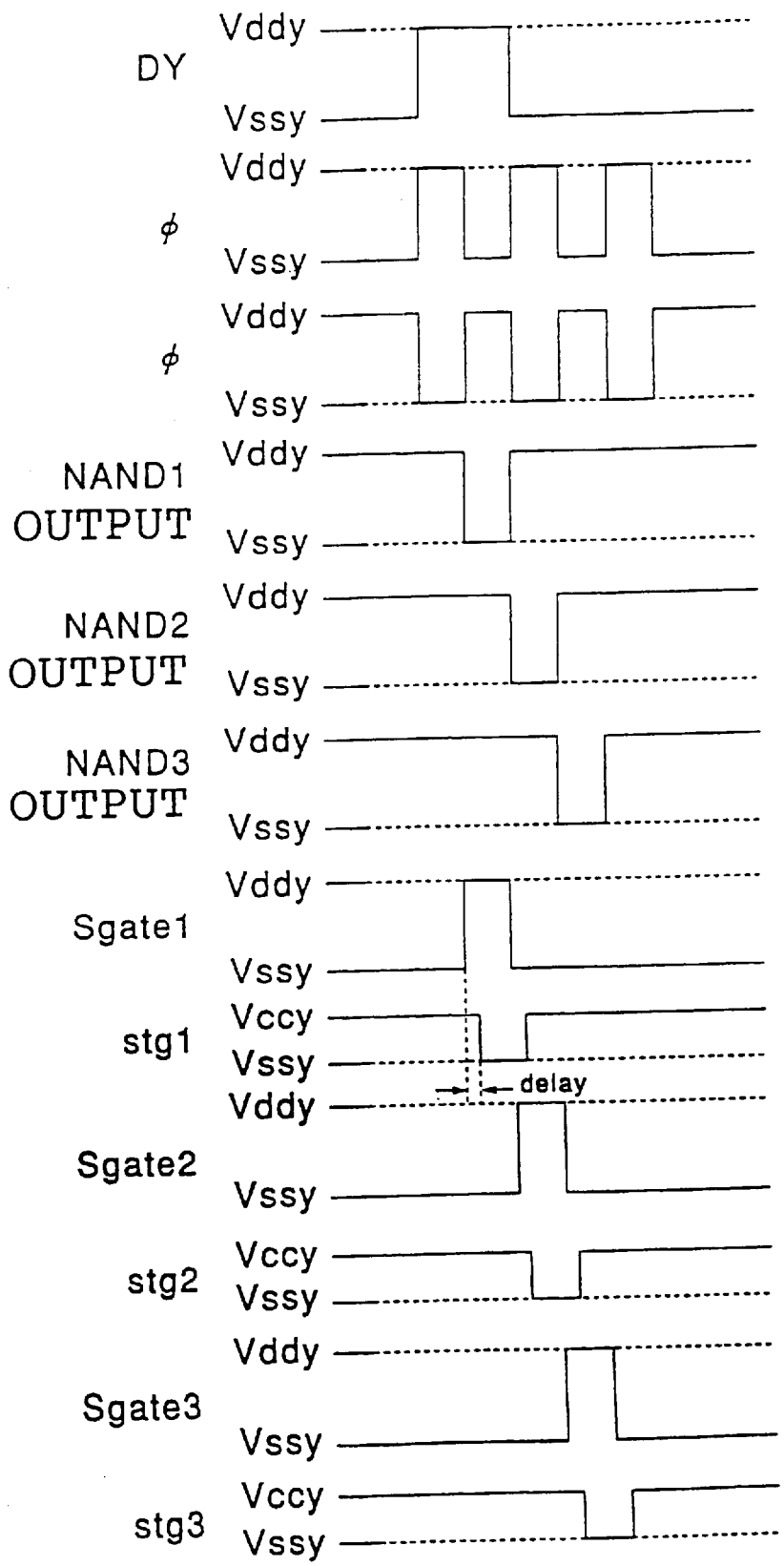
FIG. 30 is a waveform chart indicating each signal generated from the driving circuit at the scanning side shown in FIG. 29.

When the pulse signal "Pstg" is stored in the capacitor line "cline", as shown in FIG. 29, the "cline" is extracted from the driving circuit 4 in the scanning side. At the same time, in the driving circuit 4 of the scanning side, the output signal from a shift resistor 401 is outputted to any of gate stages, as the scanning signal "Sgate", through NAND gate circuit and an inverter. On the other hand, the output signal from the shift resistor 401 is outputted to the capacitor line "cline", through the NAND gate circuit and the two staged inverter, with a delay behind the scanning signal, shifting the power level in the higher potential side from "Vddy" to "Vccy", as shown in FIG. 30.

Figure 34A:
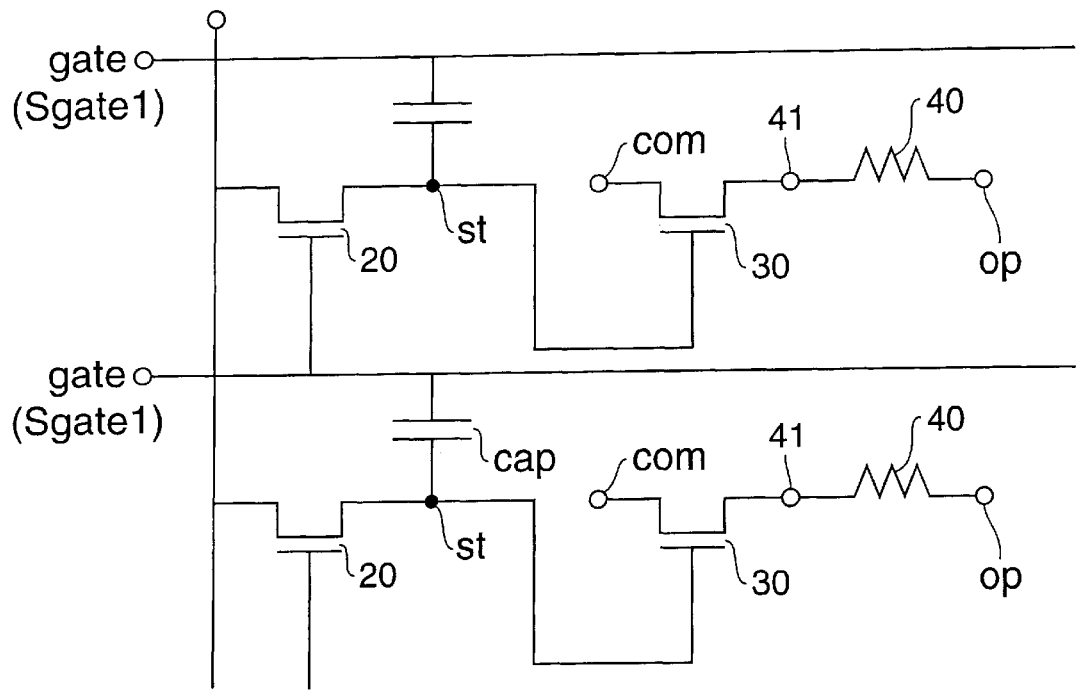
FIGS. 34(A) and (B) are a block diagram indicating a construction to form a capacitor by using an adjacent gate line and a waveform of the gate voltage signals, respectively.
Figure 34B:
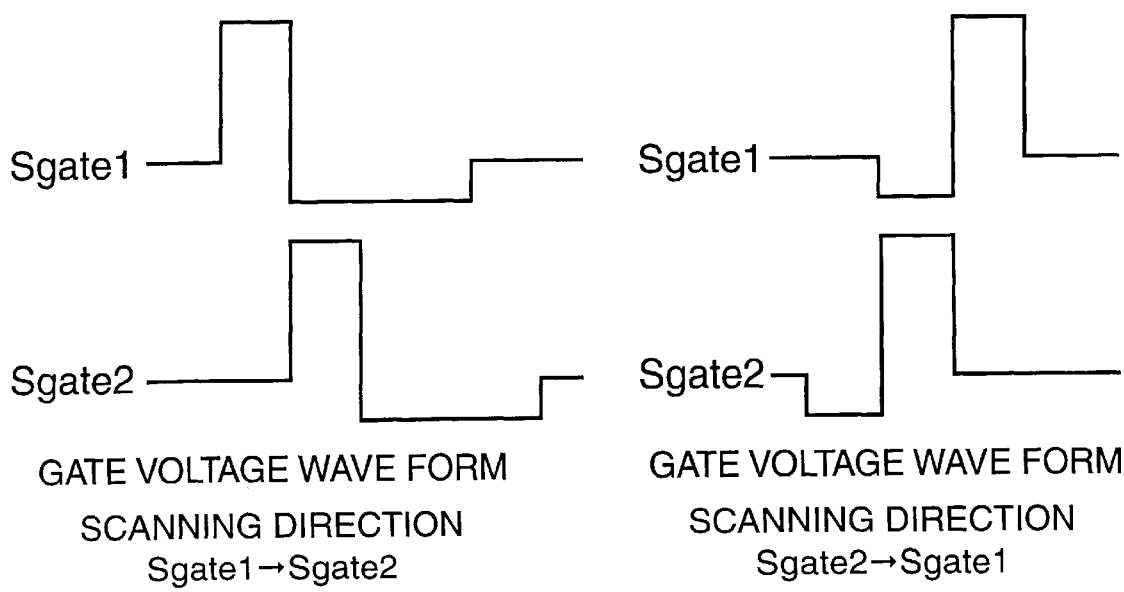

In the above mentioned embodiments and their modified embodiments, concerning the case that the holding capacity is added, the type of luminescent element having the capacitor line "cline" was described. However, since this embodiment is not limited to this structure having the capacitor line "cline", it is also possible to form one of the electrodes of the holding capacitor by the adjacent gate line. As an example of these structures, FIGS. 34(A) and (B) illustrate a circuit block diagram and a voltage waveform chart of the gate electrode in the direction of the scanning of the gate line respectively. There is an advantage that it is possible to avoid taking the trouble to form the capacitor line "cline", by forming the gate line, which is adjacent to the pixels, as the one of the electrodes of the holding capacitor.

[Other Embodiments for Carrying Out the Invention]

In any of the aforementioned embodiments, a region in the ampere-volt characteristic where the second TFT 30 is operated has not been described. If the second TFT 30 is operated at the saturated region, it is possible to prevent an abnormal current flow in the luminescent element 40, utilizing a weak constant-current characteristic. For example, the organic semiconductor film, etc., forming the luminescent element 40 can possibly have pinhole defects, even though this does not cause a complete short circuit across the electrodes of the luminescent element 40, due to the restricted current in the luminescent element with the defect.

If the second TFT 30 is operated at the linear region, it is possible to prevent the display operation from affecting by unevenness of the threshold voltage.

In addition, the TFT may be formed in a bottom gate type as well as in a top gate type, and the production method is not limited to a low temperature process in producing the TFT.

INDUSTRIAL APPLICABILITY

In the display apparatus in accordance with the present invention, as described above, the gate voltage of the second TFT at the time of the "on" corresponds to the difference between the potential of the gate electrode (the potential of the image signal), and one of the potential of the common power supply line and the potential of the pixel electrode. Therefore the display apparatus is formed such that the relative potential values of the common power supply line and the potential-holding electrode are set depending on the conduction type of the second TFT, and such that the gate voltage of the second TFT corresponds to the difference between the potential of the common power supply line and the potential of the potential-holding electrode.

For example, if the second TFT is of an N channel type, the potential of the common power supply line is set lower than that of the opposite electrode of the luminescent element. Since this potential of the common power supply line can be set low enough, different from the potential of the pixel electrode, the large "on" current in the second TFT and a high-luminance display can be obtained. When the pixel is turned "on", if the high gate voltage of the second TFT can be obtained, the potential of the image signal at the time can be reduced correspondingly. Thus, the amplitude of the image signal can be reduced to lower the driving voltage in the display apparatus. Therefore, there is an advantage that the problem of withstanding voltage, which concerns each element formed by a film, is not encountered in conjunction with the power consumption being reduced.

In the display apparatus in accordance with the present invention, since the first TFT and the second TFT are formed of the opposite conduction types, the pulse of the scanning signal to select the pixel is of opposite polarity to the potential of the image signal to turn "on" the luminescent element. When using the potential of the potential-holding electrode at the time of the "on" (the potential of the image signal to turn "on") as a reference, the potential corresponding to the higher potential of the scanning signal and the potential of the common power supply line are the same in their polarity. Therefore, if the potential of the potential-holding electrode at the time of "on" (the potential of the image signal to turn "on") is changed, both of the gate voltage of the first TFT and that of the second TFT change correspondingly, in the same direction and by the same amount. Accordingly, if the potential of the image signal to turn "on" is shifted to the direction for reducing the resistance of the first TFT at the time of the "on", within the driving voltage range of the display apparatus, higher speed operation of the display can be offered. Since, at the same time, it means that the potential of the image signal to turn "on" is shifted to the direction for reducing the resistance of the first TFT at the "on", as a result, a luminance in the display can be improved in conjunction with the above described advantages. Thus, the reduced driving voltage and the improved quality of the display can be accomplished, simultaneously.

Further, in the display apparatus in accordance with the present invention, one of the holding capacitor electrodes, which is opposite to the one that is electrically connected to the second gate electrode of the second TFT, is supplied with a pulse having a potential polarity opposite to the selecting pulse of the scanning signal, with a delay behind the selecting pulse. Therefore, the writing of the image signal into the holding capacitor can be supplemented. Thus, the potential of the image signal applied to the gate electrode of the second TFT can be shifted to the direction of a higher luminance without increasing the amplitude of the image signal.

What is claimed is:

1. A display apparatus, comprising:
   a substrate;
   a plurality of scanning lines disposed on the substrate;
   a plurality of data lines intersecting said plurality of scanning lines;
   a plurality of common power supply lines; and
   a plurality of pixels formed in a matrix by said scanning lines and said data lines, each of said pixels including:
      a first thin film transistor having a first gate electrode which is supplied with a scanning signal through at least one scanning line of said plurality of scanning lines,
      a holding capacitor which holds an image signal supplied through at least one data line of said plurality of data lines through said first thin film transistor,
      a second thin film transistor having a second gate electrode which is supplied with said image signal held by said holding capacitor, and
      a luminescent element provided between a pixel electrode corresponding to each of said pixels and an opposite electrode opposed to said pixel electrode, the luminescent element being disposed in series with the second thin film transistor, the luminescent element being able to emit light due to driving current which flows between said pixel electrode and said opposite electrode when said pixel electrode is electrically connected to at least one common power supply line of said plurality of common power supply lines through said second thin film transistor;
   wherein said second thin film transistor is of a P channel type, and a potential of said at least one common power supply line is set at a higher level than a potential of said opposite electrode.

2. The display apparatus as claimed in claim 1, a potential of said image signal supplied through said at least one data line to said pixel to be put in an "on" state is higher than or equal to the potential of said opposite electrode.

3. The display apparatus as claimed in claim 1, a potential of said image signal supplied through said at least one data line to said pixel to be put in an "off" state is lower than or equal to the potential of said at least one common power supply line.

4. The display apparatus as claimed in claim 1, said first thin film transistor and said second thin film transistor being formed as thin film transistors which are of opposite conduction types.

5. The display apparatus as claimed in claim 1, one of multiple electrodes of said holding capacitor, opposite to an electrode that is electrically connected to said second gate electrode of said second thin film transistor, is supplied with a pulse, a potential polarity of the pulse being opposite to a selecting pulse of said scanning signal with a delay behind the selecting pulse.

6. The display apparatus as claimed in claim 1, the emitting thin film of the luminescent element being an organic semiconductor film.

7. The display apparatus as claimed in claim 1, said second thin film transistor being formed so as to operate in a saturated region.

8. The display apparatus as claimed in claim 1, said second thin film transistor being formed so as to operate in a linear region.

9. A display apparatus, comprising:
   a substrate;
   a plurality of scanning lines formed on the substrate;

a plurality of data lines intersecting said plurality of scanning lines;

a plurality of common power supply lines; and a plurality of pixels formed by said scanning lines and said data lines in a matrix, each of said pixels including:

a first thin film transistor having a first gate electrode which is supplied with a scanning signal through at least one scanning line of said plurality of scanning lines, a holding capacitor which holds an image signal supplied through at least one data line of said plurality of data lines via the first thin film transistor, a second thin film transistor having a second gate electrode which is supplied with said image signal held by said holding capacitor, and a luminescent element provided between a pixel electrode corresponding to each of said pixels and an opposite electrode opposed to said pixel electrode, the luminescent element being able to emit light due to driving current which flows between said pixel electrode and said opposite electrode when said pixel electrode is electrically connected to at least one common power supply line of said plurality of common power supply lines through said second thin film transistor, the luminescent element being disposed in series with the second thin film transistor;

wherein said first thin film transistor and said second thin film transistor are formed as thin film transistors which are of opposite conduction types.

10. The display apparatus as claimed in claim 9, a polarity of a gate voltage applied to said second thin film transistor that is in "off" state pixels is the same in polarity as the potential of said second thin film transistor which is "on" state, and also a value of said gate voltage does not exceed a threshold voltage of said second thin film transistor.

11. The display apparatus as claimed in claim 10, said first thin film transistor is of an N channel type and said second thin film transistor is of a P channel type, a potential of said scanning signal to put said first thin film transistor in the "on" state is the same as a potential of said at least one common power supply line, and a potential of the gate electrode to be applied to said second thin film transistor of a pixel that is in the "off" state is lower than a potential which is obtained by subtracting a threshold voltage of said first thin film transistor from the potential of the scanning signal to put said first thin film transistor in the "on" state.

12. The display apparatus as claimed in claim 10, said first thin film transistor is of a P channel type and said second thin film transistor is of an N channel type, a potential of said scanning signal to put said first thin film transistor in the "on" state is the same as a potential of said at least one common power supply line, and a potential of said gate electrode to be applied to said second thin film transistor of a pixel that is in the "off" state is higher than a potential which is obtained by adding a threshold voltage of said first thin film transistor to the potential of the scanning signal to put said first thin film transistor in the "on" state.

13. The display apparatus as claimed in claim 9, one of multiple electrodes of said holding capacitor, opposite to an electrode that is electrically connected to said second gate electrode of said second thin film transistor, is supplied with a pulse, a potential polarity of the pulse being opposite to a selecting pulse of said scanning signal with a delay behind the selecting pulse.

14. The display apparatus as claimed in claim 9, the emitting thin film of the luminescent element being an organic semiconductor film.

15. The display apparatus as claimed in claim 9, said second thin film transistor being formed so as to operate in a saturated region.

16. The display apparatus as claimed in claim 9, said second thin film transistor being formed so as to operate in a linear region.

17. A display apparatus, comprising:

a substrate;

a plurality of scanning lines disposed on the substrate;

a plurality of data lines intersecting said plurality of scanning lines;

a plurality of common power supply lines;

a plurality of pixels formed by said scanning lines and said data lines in a matrix, each of said pixels including:

a first thin film transistor having a first gate electrode which is supplied with a scanning signal through at least one scanning line of said plurality of scanning lines, a holding capacitor which holds an image signal supplied through at least one data line of said plurality of data lines via said first thin film transistor, a second thin film transistor having a second gate electrode which is supplied with said image signal held by said holding capacitor, and a luminescent element provided between a pixel electrode corresponding to each of said pixels and an opposite electrode opposed to said pixel electrode, the luminescent element being able to emit light due to driving current which flows between said pixel electrode and said opposite electrode when said pixel electrode is electrically connected to at least one common power supply line of said plurality of common power supply lines through said second thin film transistor, the luminescent element being disposed in series with the second thin film transistor;

wherein one of multiple electrodes of said holding capacitor, opposite to an electrode that is electrically connected to said second gate electrode of said second thin film transistor, is supplied with a pulse, a potential polarity of the pulse being opposite to a selecting pulse of said scanning signal with a delay behind said selecting pulse.

18. The display apparatus as claimed in claim 17, the emitting thin film of the luminescent element being an organic semiconductor film.

19. The display apparatus as claimed in claim 17, said second thin film transistor being formed so as to operate in a saturated region.

20. The display apparatus as claimed in claim 17, said second thin film transistor being formed so as to operate in a linear region.

21. A display apparatus comprising:

a plurality of scanning lines;

a plurality of data lines;

a plurality of common power supply lines; and a plurality of pixels, each pixel of the plurality of pixels comprising:

a first transistor having a first gate electrode that is connected to one of the plurality of scanning lines;

a holding capacitor that holds a signal supplied through one of the plurality of data lines and the first transistor;

a second transistor having a second gate electrode connected to the holding capacitor, the second transistor being of P channel type; and a luminescent element provided between a pixel electrode of each pixel and an opposite electrode opposed to the pixel electrode, the luminescent element being disposed in series with the second transistor, the luminescent element being able to emit a light due to the driving current that flows between the pixel electrode and the opposite electrode when the pixel electrode is electrically connected to one common power supply line of the plurality of common power supply lines through the second transistor, a potential of the one common power supply line being set at a higher level than a potential of the opposite electrode.

22. A display apparatus comprising:

a plurality of scanning lines;

a plurality of data lines;

a plurality of common power supply lines; and a plurality of pixels, each pixel of the plurality of pixels comprising:

a first transistor having a first gate electrode that is connected to one of the plurality of scanning lines;

a holding capacitor that holds a signal supplied through one of the plurality of data lines and the first transistor;

a second transistor having a second gate electrode connected to the holding capacitor, the second transistor being of P channel type; and a luminescent element provided between a pixl electrode of the each pixel and an opposite electrode opposed to the pixel electrode, the luminescent element being disposed between the opposite electrode and the second transitor, and the luminescent element being able to emit a light due to driving current that flows between the pixel electrode and the opposite electrode when the pixel electrode is electrically connected to one common power supply line of the plurality of common power supply lines through the second transistor, a potential of the one common power supply line being set at a higher level than a potential of the opposite electrode.

23. A display apparatus comprising:

a plurality of canning lines;

a plurality of data lines;

a plurality of common power supply lines; and a plurality of pixels, each pixel of the plurality of pixels comprising:

a first transistor having a first gate electrode that is connected to one of the plurality of scanning lines;

a holding capacitor that holds a signal supplied through one of the plurality of data lines and the first transistor;

a second transistor having a second gate electrode connected to the holding capacitor; and a luminescent element provided between a pixel electrode of the each pixel and an opposite electrode opposed to the pixel electrode, the luminescent element being able to emit a light due to driving current that flows between the pixel electrode and the opposite electrode when the pixel electrode is electrically connected to one common power supply line of the plurality of common power supply lines through the second transistor, the first transistor and the second transistor being of opposite conduction types each other.

24. A display apparatus comprising:

a plurality of scanning lines;

a plurality of data lines;

a plurality of common power supply lines; and a plurality of pixels, each pixel of the plurality of pixels comprising:

a first transistor having a first gate electrode that is connected to one of the plurality of scanning lines;

a holding capacitor that holds a signal supplied through one of a plurality of data lines and the first transistor;

a second transistor having a second gate electrode connected to the holding capacitor; and a luminescent element provided between a pixel electrode of the each pixel and an opposite electrode opposed to the pixel electrode, the luminescent element being disposed between the opposite electrode and the second transistor, and the luminescent element being able to emit a light due to driving current that flows between the pixel electrode and the opposite electrode when the pixel electrode is electrically connected to one common power supply line of the plurality of common power supply lines through the second transistor, the first transistor and the second transistor being of opposite conduction types each other.

* * * * *

UNITED STATES PATENT AND TRADEMARK OFFICE
CERTIFICATE OF CORRECTION

PATENT NO.        : 6,522,315 B2
APPLICATION NO.   : 09/171224
DATED             : February 18, 2003
INVENTOR(S)       : Tokuroh Ozawa and Mutsumi Kimura It is certified that error appears in the above-identified patent and that said Letters Patent is hereby corrected as shown below:

In claim 2,
    Col. 28, line 36, after "in claim 1," insert -- for each of said pixels, --.

In claim 3,
    Col. 28, line 40, after "in claim 1," insert -- for each of said pixels, --.

In claim 6,
    Col. 28, line 56, after "in claim 1," change "the" to -- an --.

In claim 10,
    Col. 29, line 31, after "in claim 9," insert -- for each of said pixels, --,
    Col. 29, line 33, change "that is in "off" state pixels" to -- when the pixel is in an "off" state --,
    Col. 29, line 34, change "which is "on"" to -- when the pixel is in an "on" --.

In claim 11,
    Col. 29, line 43, change "the gate electrode to be applied to said" to -- the second gate electrode of said --.

In claim 12,
    Col. 29, line 55, change "said gate electrode to be applied to said" to -- said second gate electrode of said --.

In claim 14,
    Col. 30, line 1, after "in claim 9," change "the" to -- an --.

In claim 18,
    Col. 30, line 48, after "in claim 17," change "the" to -- an --.

In claim 22,
    Col. 31, line 31, change "pixl" to -- pixel --,
    Col. 31, line 32, change "of the each pixel" to -- of each of the pixels --,
    Col. 31, line 35, change "transitor" to -- transistor --.

UNITED STATES PATENT AND TRADEMARK OFFICE
CERTIFICATE OF CORRECTION

PATENT NO. : 6,522,315 B2  Page 2 of 2
APPLICATION NO. : 09/171224
DATED : February 18, 2003
INVENTOR(S) : Tokuroh Ozawa and Mutsumi Kimura It is certified that error appears in the above-identified patent and that said Letters Patent is hereby corrected as shown below:

In claim 23,
    Col. 31, line 44, change "canning" to -- scanning --,
    Col. 32, line 11, change "of the each pixel" to -- of each of the pixels --,
    Col. 32, line 19, delete "each other".

In claim 24,
    Col. 32, line 35, change "of the each pixel" to -- of each of the pixels --,
    Col. 32, line 45, delete "each other".

Signed and Sealed this

Third Day of February, 2009

JOHN DOLL
*Acting Director of the United States Patent and Trademark Office*